(12) United States Patent
Nishi et al.

(10) Patent No.: US 6,225,552 B1
(45) Date of Patent: *May 1, 2001

(54) PLANAR SOLAR CELL ARRAY AND PRODUCTION METHOD OF THE SAME

(75) Inventors: Kazuo Nishi; Makoto Hosokawa, both of Kanagawa; Yukihiro Isobe; Hideaki Ninomiya, both of Yamanashi, all of (JP)

(73) Assignees: Semiconductor Energy Laboratory Co., Ltd., Kanagawa; TDK Corporation, Tokyo, both of (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/029,611

(22) PCT Filed: Jul. 23, 1997

(86) PCT No.: PCT/JP97/02536

§ 371 Date: Mar. 11, 1998

§ 102(e) Date: Mar. 11, 1998

(87) PCT Pub. No.: WO98/04005

PCT Pub. Date: Jan. 29, 1998

(30) Foreign Application Priority Data

Jul. 24, 1996 (JP) ................................... 8-214376
Jul. 24, 1996 (JP) ................................... 8-214377

(51) Int. Cl.[7] ................................................ H01L 31/00
(52) U.S. Cl. ........................... 136/256; 136/249 MS
(58) Field of Search .......................... 136/291, 244, 136/249 MS, 256

(56) References Cited

U.S. PATENT DOCUMENTS 4,724,011 * 2/1988 Turner et al. ............... 136/249 MS
4,726,849 * 2/1988 Murata et al. ..................... 136/244
4,853,043 * 8/1989 Umemoto .......................... 136/244
5,296,043 * 3/1994 Kawakami et al. ................. 136/244
5,821,597 10/1998 Nakajima et al. .................. 257/458

FOREIGN PATENT DOCUMENTS

| 60-7094 | 1/1985 | (JP) . |
| 60-9237 | 1/1985 | (JP) . |
| 63-16677 | 1/1988 | (JP) . |
| 63-73953 | * 5/1988 | (JP) . |
| 63-115239 | 7/1988 | (JP) . |
| 63-146796 | 9/1988 | (JP) . |
| 3-239377 | 10/1991 | (JP) . |
| 5-36282 | * 9/1993 | (JP) . |
| 6-97474 | 4/1994 | (JP) . |
| 7-321354 | 12/1995 | (JP) . |
| 8-139350 | 5/1996 | (JP) . |

OTHER PUBLICATIONS

Nikkei Business, Mar. 18, 1996, pp. 71–73.*

"A Monolithic Series–Connected a–Si:II Solar Cell on an Organic Polymer Film", Nakatani et al, *Technical Digest of the International VSEC–3*, 1987, pp. 391–394.

* cited by examiner

*Primary Examiner*—Mark Chapman
(74) *Attorney, Agent, or Firm*—Arent Fox Kintner Plotkin & Kahn, PLLC

(57) ABSTRACT

The invention relates to a desired shaped plane type solar cell. The solar cell includes a plurality of photoelectric conversion devices formed by dividing the plane, a plurality of conductive paths for connecting each of the photoelectric conversion devices to each other in series, the conductive path being provided adjacent to the plurality of photoelectric conversion devices, and two drawing electrodes exposed on an opposite surface to a light irradiated surface, the electrodes being connected to two photoelectric conversion devices on both ends of the photoelectric conversion device connected in series.

26 Claims, 17 Drawing Sheets

PLANAR SOLAR CELL ARRAY AND PRODUCTION METHOD OF THE SAME

TECHNICAL FIELD

The present invention relates to a solar cell produced by using a thin film, particularly a solar cell arranged on a dial face of a watch and a production method of the same.

BACKGROUND ART

The solar cell using the amorphous silicon film is known. This solar cell using the amorphous silicon film can be thinly produced in a high productivity and light weight. Thus, such solar cell has been used as a power source of portable devices such as a table calculator, watch or the like.

Particularly, once the solar cell is mounted on a watch, the watch has a merit of no cell or battery exchange, with the result that the solar cell can largely contribute to the spread of a quartz type wrist watch.

However, when a usually shaped solar cell is mounted on a watch, the problems occur that a design of the watch is limited and that not only appearance of the watch becomes bad, but also the whole size thereof is increased. Accordingly, incorporation of the solar cell with a shape matching the dial face in a wrist watch has been tried (Nikkei Business, Mar. 18, 1996, pages 71–73).

Such a shaped solar cell has, however, the problems that the production cost thereof is further increased over a conventional solar cell and its reliability is reduced.

Alternatively, in order to enhance the productivity of the solar cell there is a technology of forming the electrode by printing.

FIG. 1a is a cross-sectional view illustrating a part of a structure of a solar cell having electrodes formed by a printing process. In this case, the solar cell shown in FIG. 1a is a type of solar cell that incident rays enter the surface (the surface of the device) side where a photoelectric conversion layer is formed.

In FIG. 1a, the reference numeral 100 denotes a glass substrate, stainless steel substrate or resin substrate, 101 a first electrode formed of, for example, aluminum, 102 a photoelectric conversion layer of amorphous silicon layers deposited in order of P-I-N types or N-I-P types from the glass substrate 100, 103 a second electrode of indium tin oxide (ITO) that is an electrode on a light incidence surface side, 104 a drawing electrode formed by using a printing process.

In the printing process, a conductive paste in which a conductive material generally composed of spherical, cigar shaped or rugby ball shaped metal particles is dispersed is printed in a desired pattern.

Thus, in a case where a printing process in which a pattern can directly be formed is utilized, the merit that production steps of electrodes can be simplified is obtained. However, there occurs the problem that pressure in a certain degree is locally applied to a portion to be printed. This pressure is particularly concentrated at a portion in which dispersed conductive materials are present.

An ITO film (second film) 103 having a structure shown in FIG. 1a, is not so hard and strong, and has a thickness of only a few thousand angstroms or less. Further, the surface of the ITO film has significant concave and convex portions. And, amorphous silicon which forms the photoelectric conversion layer 102 also is not so hard.

Therefore, high pressure is locally applied to the photoelectric conversion layer 102 due to the pressure concentration during printing. As a result, damage, such as a crack or the like can occur in the photoelectric conversion layer 102, whereby a conductive material in a conductive paste can penetrate into the crack or the like. FIG. 1b shows the state where a conductive paste penetrates into the crack or the like. The reference numeral 105 denotes a thus formed short circuit. When such short circuit 105 is formed, the first electrode 101 is electrically connected to the second electrode 103, whereby the photoelectric conversion layer does not fully function as a solar cell.

As described above, the simplification of the production steps can be accomplished by producing electrodes by using the printing process. However, the printing process damages the photoelectric conversion layer, and is likely to form a short circuit between the first electrode and the second electrode.

Therefore, the object of the present invention is to provide a solar cell for a wrist watch which can be produced at a low cost and has a high reliability, and the production method thereof.

Another object of the present invention is to provide a solar cell whose production steps can be simplified and which has high production yield.

DISCLOSURE OF INVENTION

The present invention to attain the above-mentioned objects provides a desired shaped plane type solar cell including a plurality of photoelectric conversion devices formed by dividing the plane, a plurality of conductive paths for connecting each of the photoelectric conversion devices to each other in series, the conductive path being provided adjacent to the plurality of photoelectric conversion devices, and two drawing electrodes exposed on an opposite surface to a light irradiated surface, the electrodes being connected to two photoelectric conversion devices on both ends of the photoelectric conversion device connected in series.

According to this constitution of the present invention, since an electrode portion for extracting the output can be provided on an opposite side of a light irradiated surface of a photoelectric conversion device, the structure of the extracting portion of the output can be simplified. Further, a surface area which contributes to the photoelectric conversion can be maximized. As a result, a solar cell to be incorporated into a wrist watch can be produced at a low cost, and thus produced solar cell can have a high reliability.

It is preferable that each of the photoelectric conversion devices includes a substrate, a first electrode layer deposited on the substrate, a photoelectric conversion semiconductor layer deposited on the first electrode layer, and a light transmitting second electrode layer deposited on the photoelectric conversion semiconductor layer, and that one of the two externally drawing electrodes is connected to the second electrode layer of the photoelectric conversion device on one end thereof, and the other of the two externally drawing electrodes is connected to the first electrode layer of the photoelectric conversion device on the other end thereof.

It is desirable that the solar cell further includes a first through-slot which electrically connects the second electrode layer to one of the externally drawing electrodes.

It is also desirable that the first through-slot is formed on a region where the first electrode layer and a part of the photoelectric conversion semiconductor layer is isolated from other portions.

It is preferable that the solar cell further includes a second through-slot which electrically connects the first electrode layer to the other externally drawing electrode.

It is preferable that the solar cell is circular, and that the plurality of photoelectric conversion devices are plurality of fan-shaped photoelectric conversion devices formed so that the circular plane is divided in radial directions.

It is also preferable that the plurality of conductive paths and the two externally drawing electrodes are provided on outer peripheral portions of the plurality of photoelectric conversion devices.

It is preferable that the plurality of conductive paths and the two externally drawing electrodes are provided on outer peripheral portions of the plurality of photoelectric conversion devices, the solar cell being polygonal, the plurality of photoelectric conversion devices being plurality of triangle-shaped photoelectric conversion devices formed so that the polygonal plane is divided in radial directions.

The plurality of conductive paths are provided between the plurality of photoelectric conversion devices and the two externally drawing electrodes are provided on outer sides of the photoelectric conversion devices on both ends, the solar cell being rectangular, the plurality of photoelectric conversion devices being plurality of rectangular photoelectric conversion devices formed so that the rectangular plane is divided in longitudinal directions.

It is desirable that each of the photoelectric conversion devices includes a substrate, a first electrode layer deposited on the substrate, a photoelectric conversion semiconductor layer deposited on the first electrode layer, a resin layer partially deposited on the photoelectric conversion semiconductor layer, a light transmitting second electrode layer deposited on the photoelectric conversion semiconductor layer and the resin layer, and a third electrode layer deposited on the second electrode layer where the resist layer exists.

The photoelectric conversion semiconductor layer is preferably composed of a PIN type non-single crystalline silicon film, and the second electrode layer is preferably composed of an ITO film.

It is preferable that the first electrode layer is composed of an aluminum film, and the third electrode layer is composed of a conductive paste film that dispersed metal particles in the binder.

The externally drawing electrode is preferably composed of a conductive paste film that dispersed metal particles in the binder.

According to the present invention, there is further provided a solar cell including a first electrode layer, a photoelectric conversion semiconductor layer deposited on the first electrode layer, a resin layer partially deposited on the photoelectric conversion semiconductor layer, a second electrode layer deposited on the photoelectric conversion semiconductor layer and the resin layer, and a third electrode layer deposited on the second electrode layer where the resin layer exists.

Even when an electrode is formed on an upper portion of a photoelectric conversion device by using a printing process, it is possible to efficiently prevent damaging the photoelectric conversion device. Further, it is possible to produce a solar cell at a high yield.

It is preferable that the photoelectric conversion semiconductor layer is composed of a PIN type non-single crystalline silicon film.

The second electrode layer is preferably composed of an ITO film.

It is preferable that the first electrode layer is composed of an aluminum film.

It is preferable that the third electrode layer is composed of a conductive paste film that dispersed metal particles in the binder.

It is also preferable that the externally drawing electrode is composed of a conductive paste film that dispersed metal particles in the binder.

According to the present invention, there is still further provided a method for producing a solar cell including a step of depositing a first electrode layer on a substrate, a step of depositing a photoelectric conversion semiconductor layer deposited on the first electrode layer, a step of depositing a resin layer partially deposited on the photoelectric conversion semiconductor layer, a step of depositing a second electrode layer deposited on the photoelectric conversion semiconductor layer and the resin layer, and a step of depositing a third electrode layer deposited on the second electrode layer where the resin layer exists.

It is preferable that the deposition step of the photoelectric conversion semiconductor layer is a step of depositing a PIN type non-single crystalline silicon film.

It is also preferable that the deposition step of the second electrode layer is a step of depositing an ITO film, the deposition step of the first electrode layer is a step of an aluminum film, and the production step of the third electrode layer is a step of forming a conductive paste film that dispersed metal particles in the binder.

BEST MODE FOR CARRYING OUT THE INVENTION

Figure 1A:
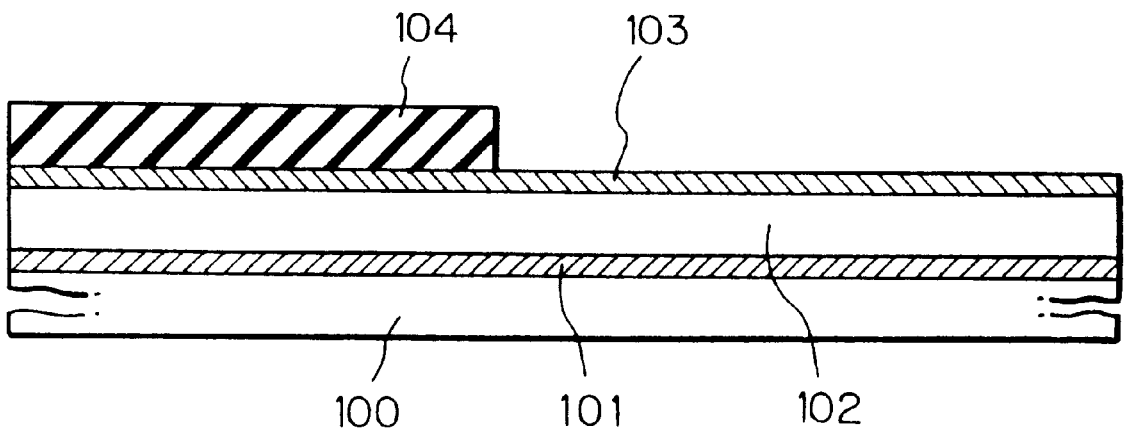
FIGS. 1a and 1b are cross-sectional views of a part of constitution of a solar cell with an electrode formed by using a conventional printing process described above.
Figure 1B:
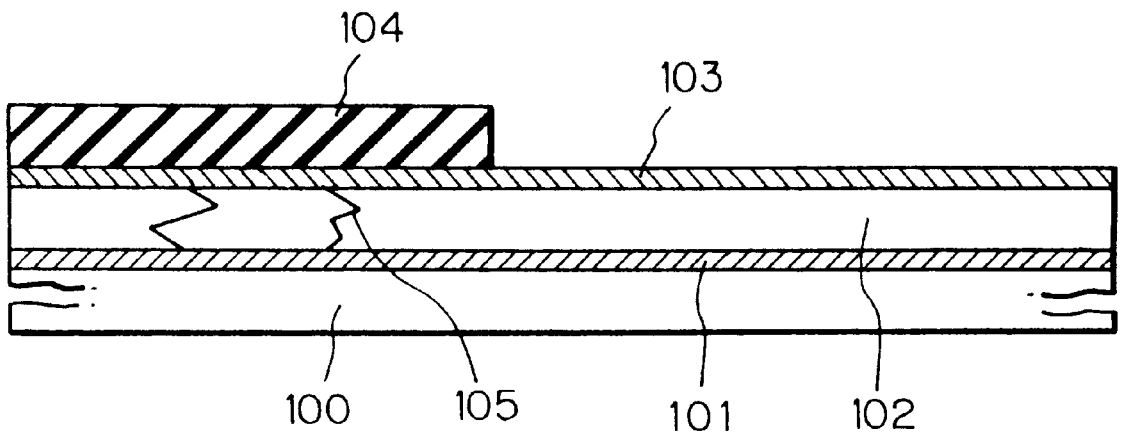
Figure 2:
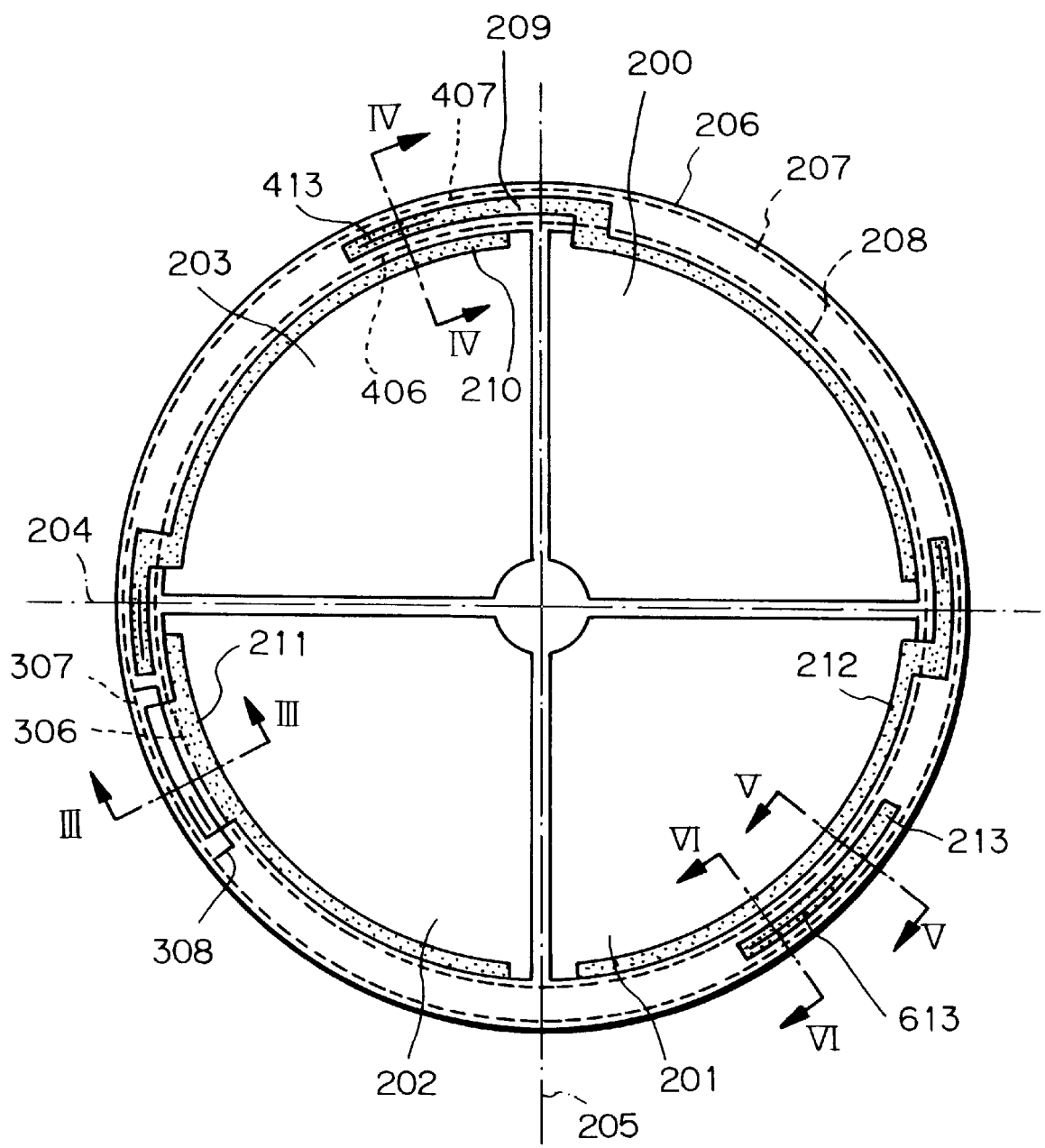
FIG. 2 is a plan view of a solar cell which is arranged on a dial face of a watch as an embodiment of the present invention, the solar cell being viewed from above.

FIG. 2 is a plan view of a solar cell which is arranged on a dial face of a watch as an embodiment of the present invention, the solar cell being seen from the upper portion. The solar cell shown in FIG. 2 uses a flexible resin film with a thickness of 70 μm as a substrate.

In FIG. 2, each of four regions 200, 201, 202 and 203 is one unit which functions as a photoelectric conversion device. Each photoelectric conversion device includes a first electrode, a photoelectric conversion layer deposited in order of N-I-P types from the substrate side, and a second electrode, which were sequentially deposited. These four photoelectric conversion devices 200, 201, 202 and 203 are connected in series, and the photoelectromotive force thereof is extracted from an externally drawing electrodes 312 (FIG. 3h) and 512 (FIG. 5) which will be described later.

The four photoelectric conversion devices 200, 201, 202 and 203 are divided along cross-shaped division lines 204 and 205. The divisions are carried out by scribing (referred to as laser scribing) using a laser beam.

The solar cell is cut by irradiation of a laser beam or mechanically blanked in the last step to form a circular outer periphery 206.

The broken line 207 shows the position of the outer periphery portion of each of the photoelectric conversion devices 200, 201, 202 and 203. The outer periphery portion 207 is formed by a laser scribing, as shown in FIGS. 3d and 4d which will be described later. The annular region between the outer periphery portion 207 and the outer periphery 206 of the solar cell is a region which does not function as a solar cell.

The broken line 208 shows a position in which a second electrode (transparent electrode on the light incidence side) of each photoelectric conversion device is selectively scribed. This scribed portion is also formed by a laser scribing, as shown in FIGS. 3c and 4c which will be described later.

These scribed portions (lines) 207 and 208 form an annularly closed track, that has a loop shape in which the start point of scribing is connected to the end point thereof.

FIGS. 3a to 3h are cross-sectional views taken along the line III—III of FIG. 2, illustrating the production steps of the solar cell of the embodiment thereof. That is, FIGS. 3a to 3h show the production steps of a portion of a drawing electrode (an electrode on a plus side).

FIGS. 4a to 4g are cross-sectional views taken along the line IV—IV of FIG. 2, illustrating the production steps of the solar cell of the present embodiment. That is, FIGS. 4a to 4g show the production steps of the connecting portion of the photoelectric conversion device 200 and the photoelectric conversion device 203.

In these drawings, the scale of the film thickness and others has no relation to the actual relative scale thereof.

In the present embodiment, a PEN (polyethylene naphthalate) film was used as a material of the substrate 300. As the material thereof, any material which is well known as an industrial plastic material, such as PET (polyethylene terephthalate) and the like, as well as the above-mentioned PEN can also be used. Further, as the material as the substrate 300, a glass substrate or a metallic substrate can also be used.

Various steps which are described below are sequentially carried out with respect to a long substrate with a few tenths of a meter to a few hundredths of a meter until an outward appearance shown in the plan view of FIG. 2 is obtained after the final step. And in the final step, the solar cell with the outward appearance shown in FIG. 2 is formed. In the sequential steps, during winding the long substrate wound around a roll, on another roll, various steps such as film deposition, printing, various kinds of baking, laser scribing and the like are carried out.

Figure 3A:
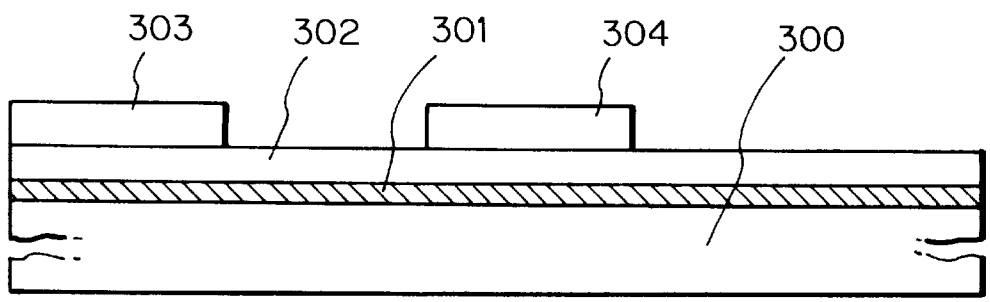
FIGS. 3a to 3h are cross-sectional views taken along the line III—III of FIG. 2, illustrating the production steps of the solar cell of the embodiment thereof.
Figure 4A:
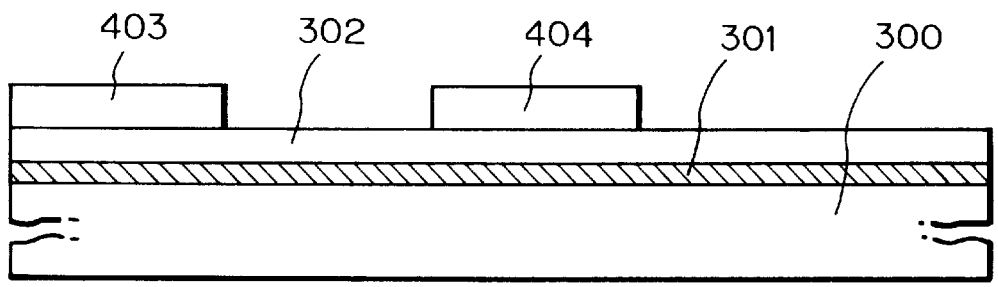
FIGS. 4a to 4g are cross-sectional views taken along the line IV—IV of FIG. 2, illustrating the production steps of the solar cell of the embodiment thereof.

First, as shown in FIGS. 3a and 4a, an aluminum electrode 301 is deposited on a substrate 300. On the aluminum electrode 301 is formed a photoelectric conversion layer 302 of semiconductor deposited in order of N-I-P types from the substrate 300 side. The film formation of the aluminum electrode 301 is carried out by a sputtering process. Further, the formation of the photoelectric conversion layer 302 is carried out by depositing some layers by use of a plasma CVD process.

Next, first resist layers 303 and 304 (403 and 404) are formed by a printing process. The formation of the resin layers are continuously carried out with respect to a long film substrate. The resin layer 303 (404) is provided on an annular region (where a scribed slot 307 (407) is formed later) which corresponds to the outer periphery 207. Further, the resin layer 304 (404) is provided on an annular region (where a scribed slot 306 (406) is formed later), which corresponds to a circle shown by a scribed portion 208 in FIG. 2. Thus, a structure of the solar cell shown in FIGS. 3a and 4a, is obtained.

Figure 3B:
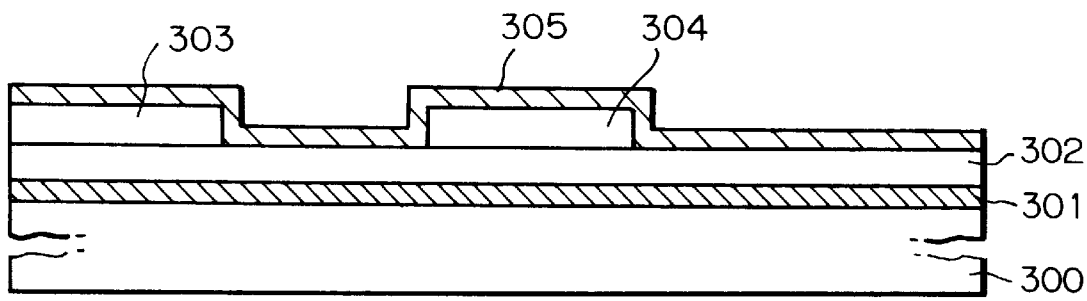
Figure 3C:
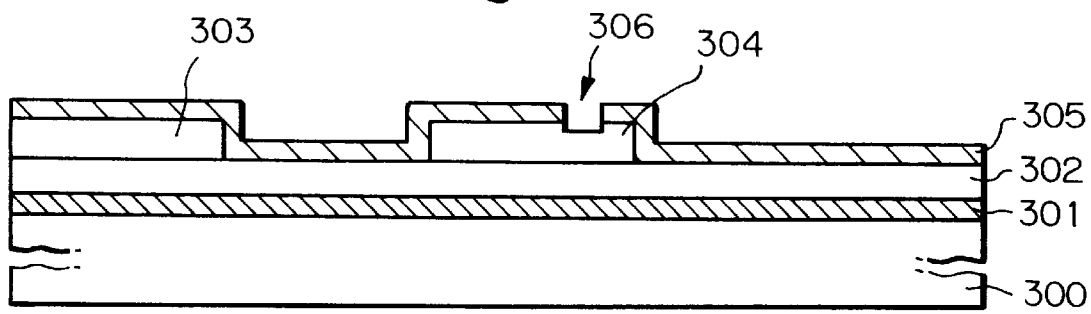
Figure 3D:
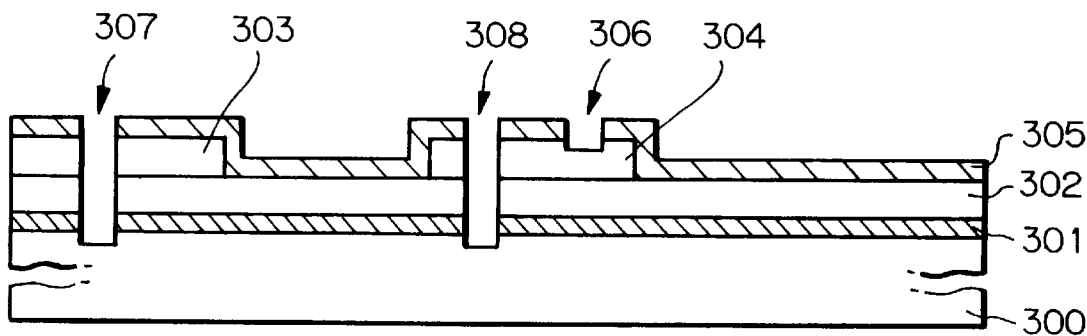
Figure 4B:
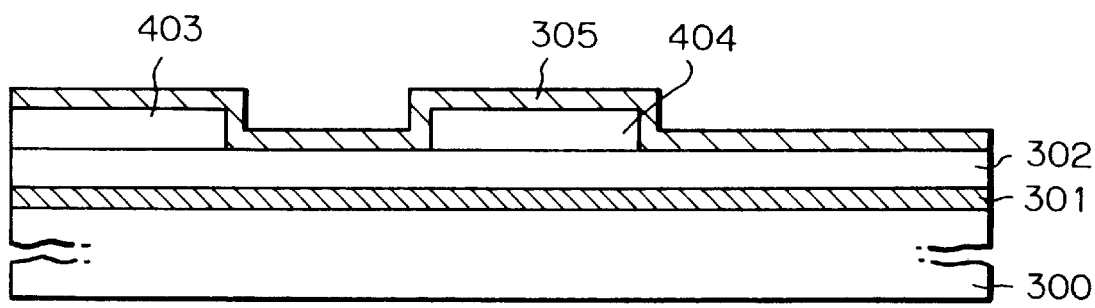
Figure 4C:
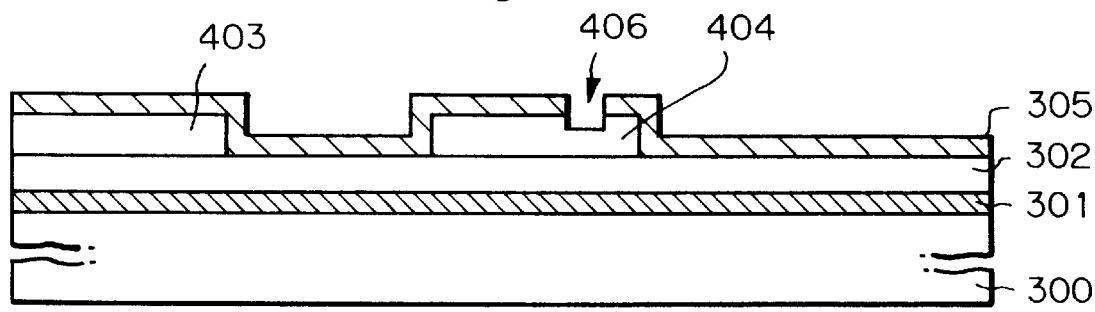
Figure 4D:
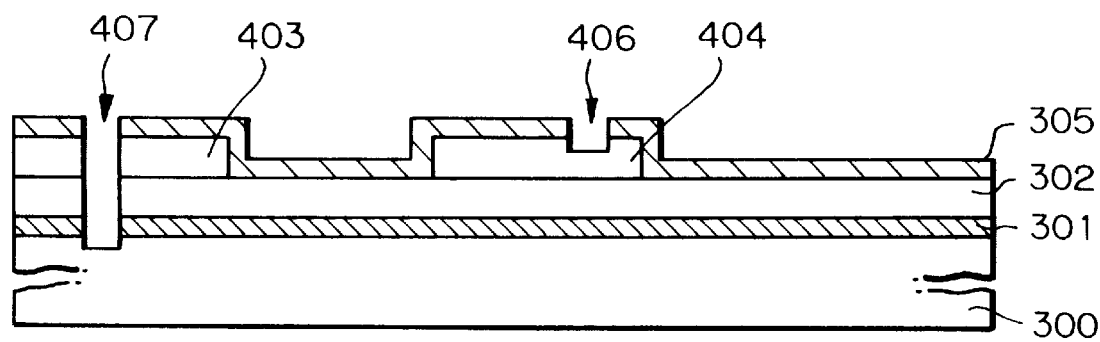

Next, an ITO electrode 305 which is a transparent electrode is deposited on the entire exposed surface. The formation of this ITO film is continuously carried out with respect to the long film wound around the roll. Thus, a structure of the solar cell shown in FIGS. 3b and 4b is obtained.

Scribing is then carried out by irradiation of a laser beam. This step is referred to as a laser scribing step. In this laser scribing step, scribing in a required layer is carried out by irradiation of a laser beam while scanning a YAG laser with a spot diameter of 80 μm.

In this case, scribing of ITO film 305 is selectively carried out by a laser scribing process. In this step, the ITO 305 film is scribed to form a slot 306 (406) (see FIGS. 3c and 4c). This slot 306 (406) is annularly formed as a scribed portion 208 in FIG. 2.

When a laser beam is irradiated to form the slot 306 (406), it is important that the resin layer 304 (404) exists as a base layer. If the resin layer 304 (404) does not exist, the laser beam can reach the photoelectric conversion layer 302 due to the dispersion of the output of the laser beam. In a further extreme case, a slot can be formed in even the aluminum electrode 301 by the laser beam.

It is no problem that the photoelectric conversion layer 302 is scribed in the lower portion of the scribed portion 208. This is because the photoelectric conversion layer does not contribute to the photoelectric conversion to be required. However, when the laser beam reaches the aluminum electrode 301, a risk of forming a short circuit occurs between the transparent electrode 305 and the aluminum electrode 301. That is, the material of the aluminum electrode 301 is melted by the energy of the laser beam, and the melt reaches the transparent electrode 305, whereby possibility of forming a short circuit occurs between both electrodes. Since the distance between the transparent electrode 305 and the aluminum electrode 301 is only about 1 μm, the possibility of forming a short circuit between both electrodes is significantly high.

Further, when the aluminum electrode 301 is completely cut off due to too strong irradiation energy of the laser beam, there arises the possibility that photoelectric conversion devices can not be connected to each other later. That is, when the aluminum electrode 301 is completely cut off in the lower portion of the scribed portion 208 of the ITO electrode 305, in a cross sectional portion (shown in FIGS. 4c and 4g) shown by the line IV—IV of FIG. 2, the electrical connection between the photoelectric conversion device 200 and the photoelectric conversion device 203 becomes impossible. Even if the aluminum electrode 301 is not completely cut off in the lower portion of the scribed portion 208 of the ITO electrode 305, when the portion is damaged by the irradiation of laser beam, there arise contact failure between the photoelectric conversion devices and the increase of contact resistance.

According to the constitution shown by the present embodiment, the laser beam does not reach the aluminum electrode 301 due to the presence of the resin layer 404. Thus, it can be avoided to electrically connect the transparent electrode 305 to the aluminum electrode 301. Further, cutting and damaging of the aluminum electrode 301 can also be prevented. As a result, the production yield can drastically be enhanced. Thus, the structure shown in FIGS. 3c and 4c is obtained.

Next, a laser scribing is carried out again at a higher output of the laser beam than in the laser scribing for the formation of the above-described slot 306 (406). In this step, a slot 307 (407) and a slot 308 (see FIGS. 3d and 4d) are formed.

As apparent from these drawings, in this step, the conditions of the irradiation of laser beam are set, so that the bottom portions of the slots 307 (407) and 308 can be extended within the substrate 300. The conditions of the irradiation of laser beam for the formation of the slots 307 (407) and 308 may be the same.

The slot 307 (407) is annularly formed, as shown by the scribed portion 207 in FIG. 2.

The slot 308 is formed to cut the aluminum electrode 301 around the periphery of a region for providing an externally drawing electrode. This slot 308 is communicated with the slot 307. The slots 307 and 308 are formed so that a part (a closed region, in which a through-slot 309 which will be later described is formed) of the aluminum electrode 301 surrounded by these slots, 307 and 308, is completely electrically isolated from the periphery.

The short circuit between the aluminum electrode 301 and the ITO electrode 305 can be prevented by the presence of the first resin layers 303 (403) and 304, during the formation of the slots 307 (407) and 308. That is, when these resin layers 303 (403) and 304 do not exist, a short circuit between the aluminum electrode 301 and the ITO electrode which is near the aluminum electrode 301 is often formed by a part of the melted aluminum electrode.

Thus, the structure shown in FIGS. 3d and 4d is obtained.

Figure 3E:
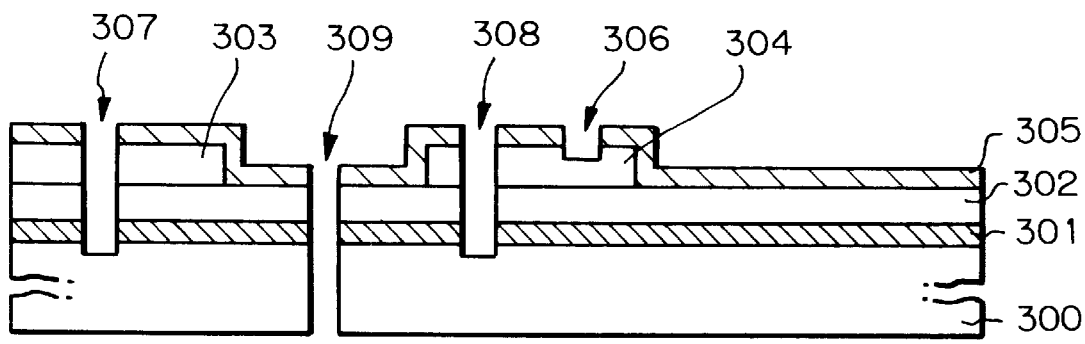

Next, a through-slot 309 shown in FIG. 3e is formed by irradiation of a laser beam. This slot 309 is penetrated to the back of the substrate 300, with the back being a position denoted by the reference numeral 211 in FIG. 2. This slot 309 is used as a conductive path or channel 313 in forming a drawing electrode which is finally connected to the back of the substrate 300. The position of the slot 309 is a position of an externally drawing electrode.

Figure 3F:
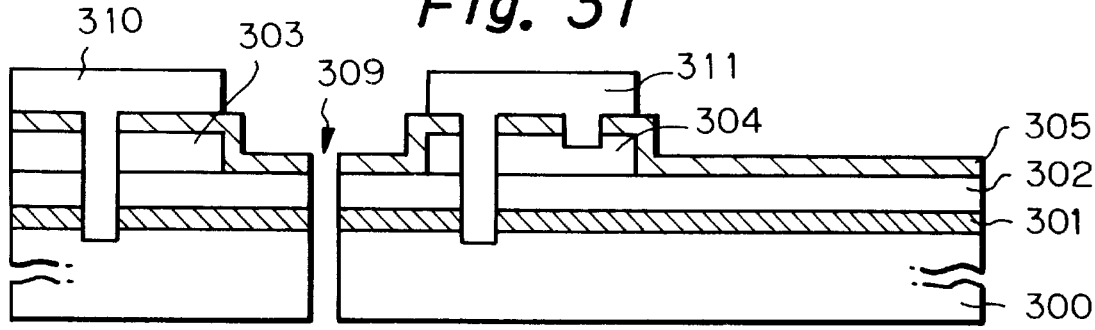
Figure 4E:
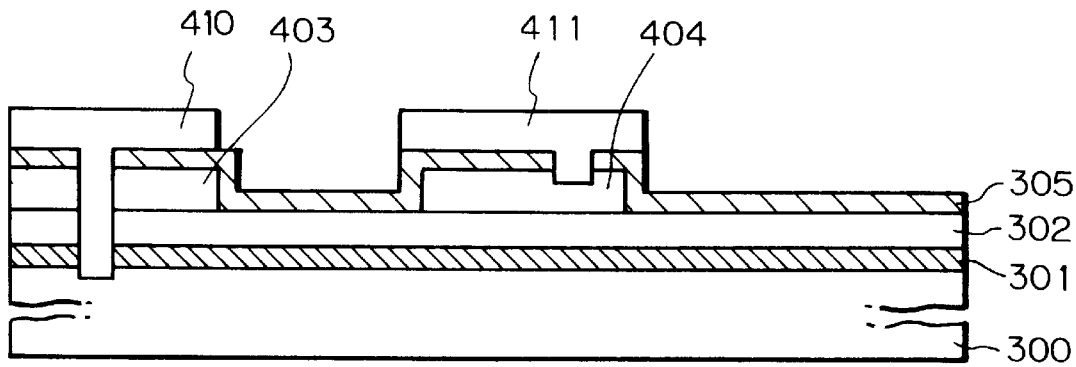

After that, as shown in FIGS. 3f and 4e, second resin layers 310 (410) and 311 (411) are formed. These resin layers 310 (410) and 311 (411) play a role in filling the slots 306 (406), 307 (407) and 308 with a resin material. Further, the resin layers also act as an isolation film which is a lower layer for a contact electrode.

These second resin layers 310 (410) and 311 (411) are formed by use of a printing process.

As shown in FIGS. 3g and 4f and FIGS. 5 and 6, which will be described later, contact electrodes 209, 210, 211, 212 and 213 are then formed by use of a silver paste, These contact electrodes are also formed by a printing process. Each position of the contact electrodes 209, 210, 211, 212 and 213 is shown in FIG. 2.

Figure 4F:
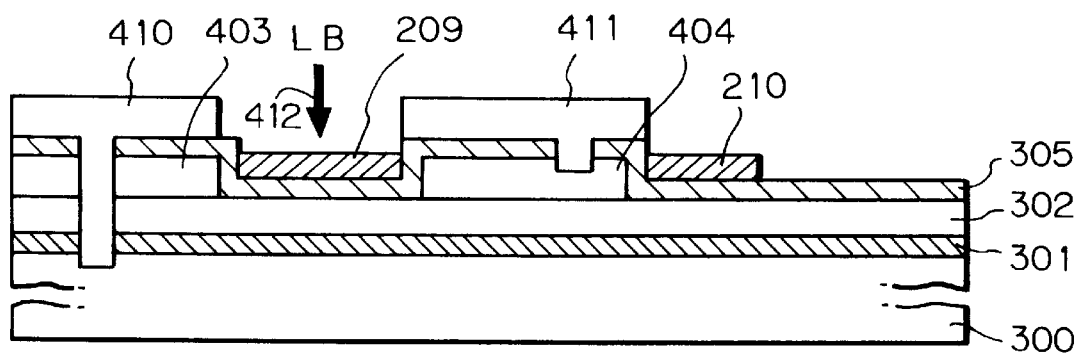
Figure 4G:
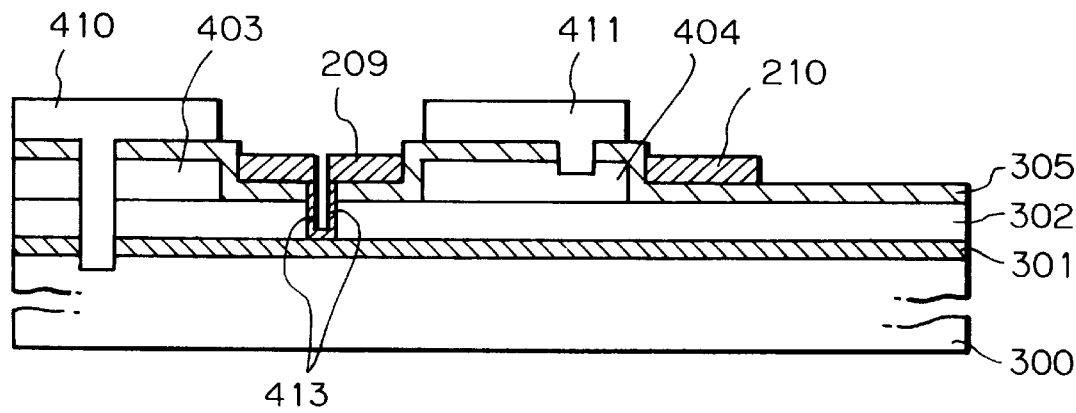

After that, irradiation of a laser beam is carried out at a portion in a direction of an arrow 412 in FIG. 4f to form a conductive path 413 for electrically connecting the aluminum electrode 301 to the contact electrode 209, as shown in FIG. 4g. In this step, the conductive path 413 is formed by forming a slot for the contact, and at the same time, by melting both the silver paste of the contact electrode 209 and the aluminum electrode 301. This step is well known as a laser bonding.

Thus, a structure with a cross-section shown in FIG. 4g taken along the line IV—IV of FIG. 2 is obtained. As shown in FIG. 4g, the aluminum electrode 301 of the photoelectric conversion device 203 is electrically connected to the silver paste pattern (contact electrode) connected to the ITO electrode of the photoelectric conversion device 200 by the laser bonding.

Consequently, a state where the photoelectric conversion device 203 is connected to the photoelectric conversion device 200 in series is obtained. Three connected portions other than the above-mentioned connected portions are formed in this structure. According to thus connected structure, Each of the photoelectric conversion devices 203, 200, 201 and 202 is connected to each other in series.

Figure 3G:
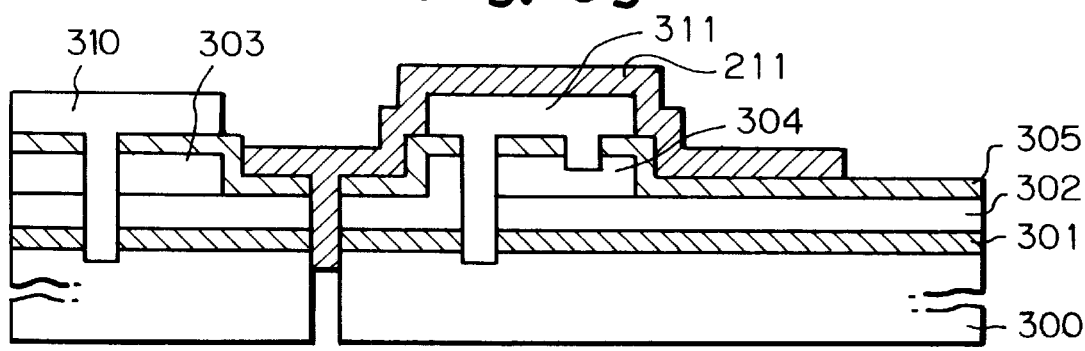
Figure 3H:
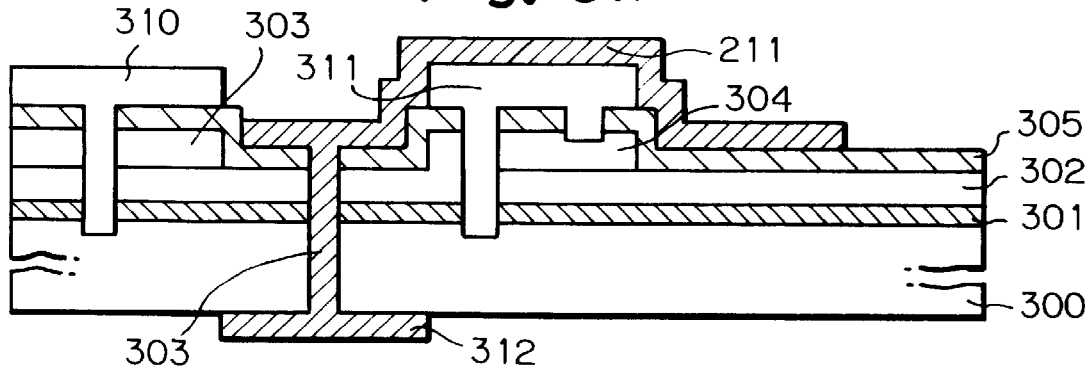

On the other hand, as shown in FIGS. 3g and 3h, which are cross-sectional views taken along the line III—III of FIG. 2, after forming a contact electrode 211 of a silver paste, a contact electrode 312 is formed on the back of the substrate 300 by use of a silver paste. The formation of this contact electrode 312 is also carried out by a printing process. This contact electrode 312 is electrically connected to the contact electrode 211 through the conductive path 313 of a silver paste formed in the through-slot 309, and is therefore, electrically connected to the ITO electrode 305 of the photoelectric conversion device 202.

Thus, the contact electrode 312 formed on the opposite side to the surface side shown in FIG. 2 acts as a drawing electrode connected to the ITO electrode 305 (see FIG. 3h) of the photoelectric conversion device 202 (see FIG. 2).

The ITO electrode 305 is in contact with a P type semiconductor layer on the light incidence side for the photoelectric conversion device 202. Therefore, the contact electrode 312 is a drawing electrode in which the plus voltage is output.

Figure 5:
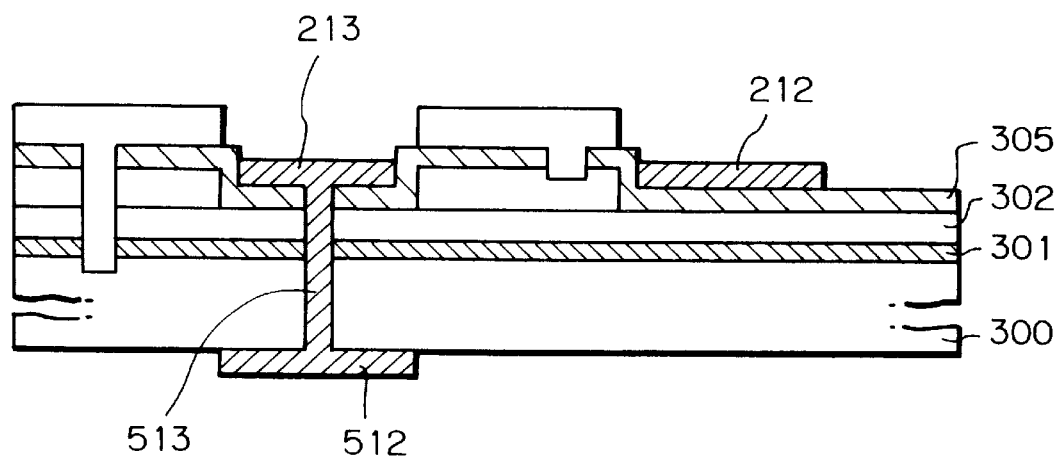
FIG. 5 is a cross-sectional view taken along the line V—V of FIG. 2, illustrating the structure of the solar cell of the embodiment thereof.
Figure 6:
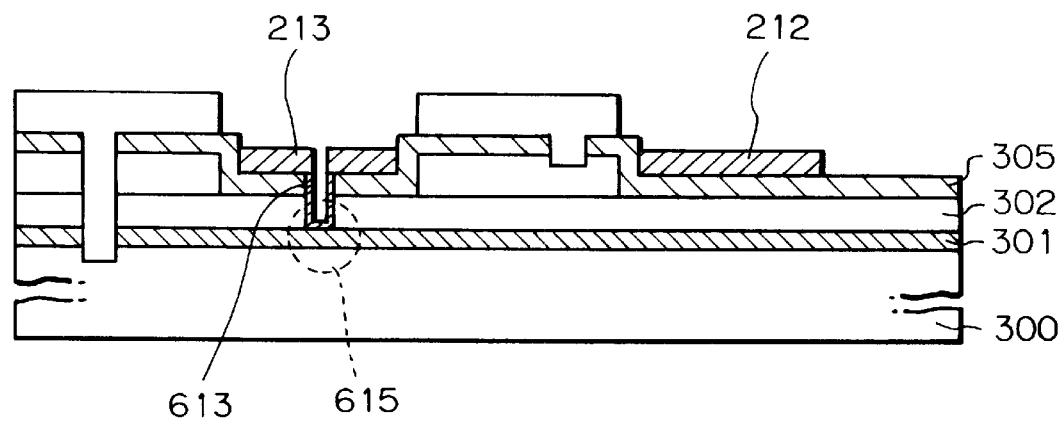
FIG. 6 is a cross-sectional view taken along the line VI—VI of FIG. 2, illustrating the structure of the solar cell of the embodiment thereof.

FIG. 5 is a cross-sectional view taken along the line V—V of FIG. 2, illustrating a structure of the solar cell of the present embodiment, and FIG. 6 is a cross-sectional view taken along the line VI—VI of FIG. 2, illustrating a structure of the solar cell of the present embodiment. In this portion of the structure is formed a drawing electrode (minus voltage side) drawn from the N type semiconductor layer of the photoelectric conversion device 201.

As shown in FIG. 5, a contact electrode (drawing electrode) 512 of a silver paste electrically connected to the aluminum electrode 301 (aluminum electrode of the photoelectric conversion device 201) through a conductive path 513 is formed on the back of the substrate 300.

In order to ensure the electrical connection between the aluminum electrodes 301 and the output electrode 512, a cross-section taken along the line VI—VI of FIG. 2 has a structure as shown in FIG. 6. That is, the contact is formed at a position denoted. Particularly, the aluminum electrode 301 is electrically connected to the contact electrode 213 of the silver paste through a conductive path.

Finally, an individual solar cell is completed by blanking a number of solar cells which were formed to have a long film as a base substrate. Thus, a number of solar cells whose outward appearances are shown in FIG. 2 are obtained.

Thus, the solar cell showing the outward appearance from the top in FIG. 2 is constructed so that it extracts the photoelectromotive force from the drawing electrode 312 drawn from a P type semiconductor layer of the photoelectric conversion device 202 (which is on the back of the electrode 211 (FIG. 3h)), and the drawing electrode 512 drawn from an N type semiconductor layer of the photoelectric conversion device 201 (which is on the back of the electrode 213 (FIG. 5)).

Figure 7:
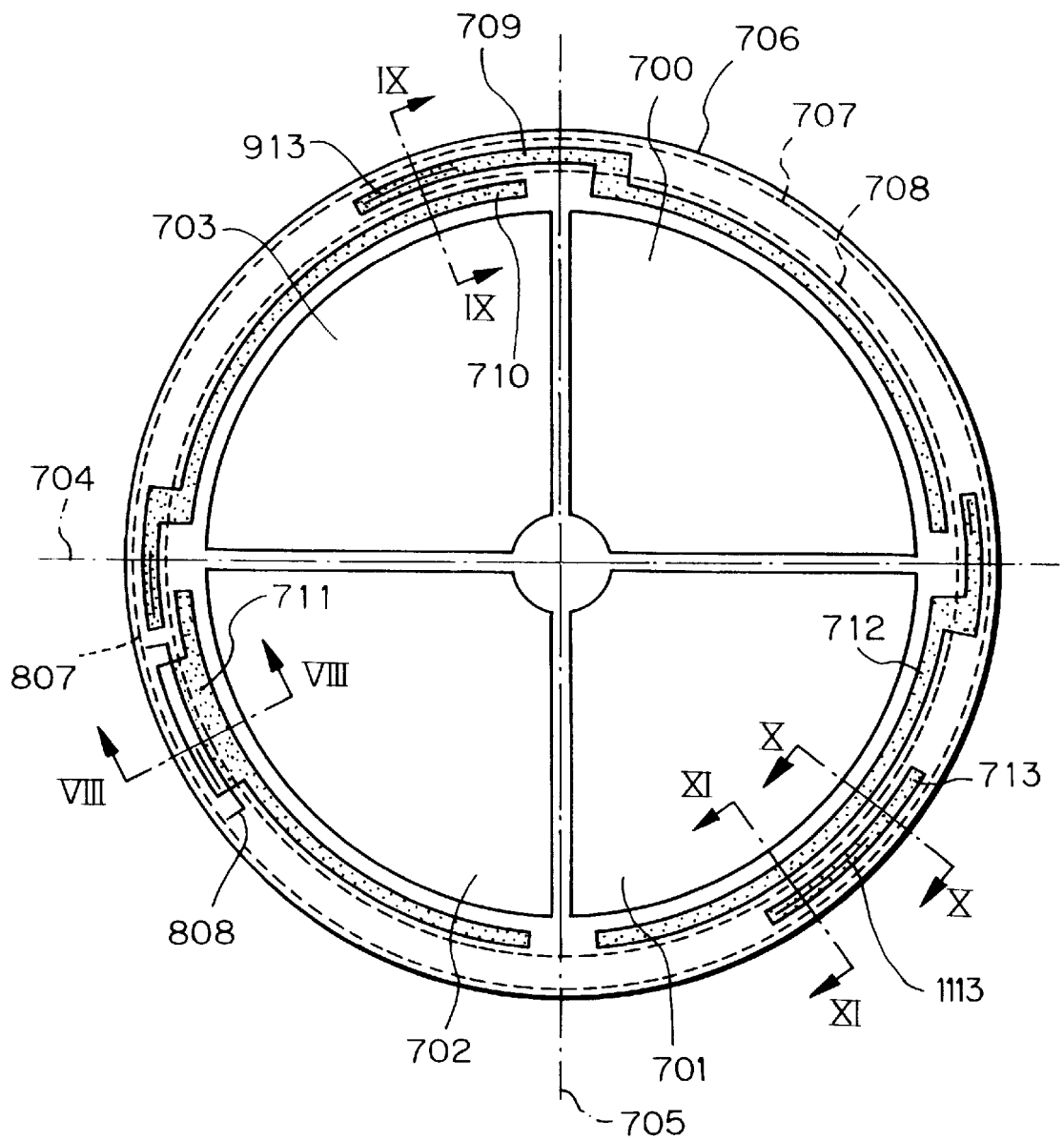
FIG. 7 is a plan view of a solar cell which is arranged on a dial face of a watch as another embodiment of the present invention, the solar cell being viewed from above.

FIG. 7 is a plan view of a solar cell which is arranged on a dial face of a watch as another embodiment of the present invention, the solar cell being viewed from above. The solar cell shown in FIG. 7 uses a flexible resin film with a thickness of 70 μm as a substrate.

In FIG. 7, each of four regions 700, 701, 702 and 703 is one unit which functions as a photoelectric conversion device. Each photoelectric conversion device includes a first electrode, a photoelectric conversion layer deposited in order of N-I-P types from the substrate side, and a second electrode, which were sequentially deposited. These four photoelectric conversion devices 700, 701, 702 and 703 are connected in series, and the photoelectromotive force thereof is extracted from externally drawing electrodes 812 (FIG. 8h) and 1012 (FIG. 10) which will be described later.

The four photoelectric conversion devices 700, 701, 702 and 703 are divided along cross-shaped division lines 704 and 705. These divisions are carried out by scribing (referred to as laser scribing) using a laser beam.

The solar cell is cut by irradiation with a laser beam or mechanically blanked in the last step to form a circular outward periphery 706.

The broken line 707 shows the position of the outer periphery portion of each of the photoelectric conversion devices 700, 701, 702 and 703. The outer periphery portion 707 is formed by a laser scribing, as shown in FIGS. 8d and 9d. The annular region between the outer periphery portion 707 and the outward periphery 706 of the solar cell is a region which does not function as a solar cell.

The broken line 708 shows a position in which a second electrode (transparent electrode on the light incidence side) of each photoelectric conversion device is selectively scribed. This scribed portion is also formed by a laser scribing, as shown in FIGS. 8c and 9c which will be described later.

These scribed portions (lines) 707 and 708 form an annularly closed track that has a loop shape in which the start point of scribing is connected to the end point thereof.

FIGS. 8a to 8h are cross-sectional views taken along the line VIII—VIII of FIG. 7, illustrating the production steps of the solar cell of the embodiment thereof. That is, FIGS. 8a to 8h show the production steps of a portion of a drawing electrode (an electrode on a plus side).

FIGS. 9a to 9g are cross-sectional views taken along the line IX—IX of FIG. 7, illustrating the production steps of the solar cell of the present embodiment. That is, FIGS. 9a to 9g show the production steps of the connecting portion of the photoelectric conversion device 700 and the photoelectric conversion device 703.

In these drawings, the scale of the film thickness and others has no relation to the actual relative scale thereof.

In the present embodiment, a PEN (polyethylene naphthalate) film was used as a material of the substrate 800. As the material thereof, any material which is well known as an industrial plastic material, such as PET (polyethylene terephthalate) and the like, as well as the above-mentioned PEN can also be used. Further, as the material of the substrate 800, a glass substrate or a metallic substrate can also be used.

Various steps which are described below are sequentially carried out with respect to a long substrate with a few tenths of a meter to a few hundredths of a meter until an outward appearance shown in the plan view of FIG. 7 is obtained after the final step. And in the final step, the solar cell with the outward appearance shown in FIG. 7 is formed. In the sequential steps, during winding the long substrate wound around a roll, on another roll, various steps such as film deposition, printing, various kinds of baking, laser scribing and the like are carried out.

Figure 8A:
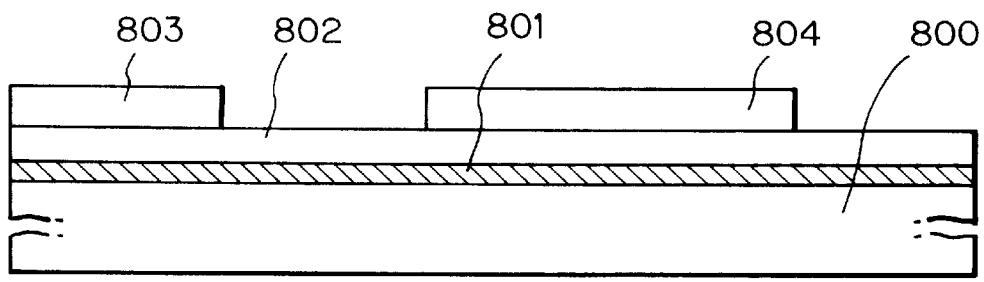
FIGS. 8a to 8h are cross-sectional views taken along the line III—III of FIG. 7, illustrating the production steps of the solar cell of the embodiment thereof.
Figure 8B:
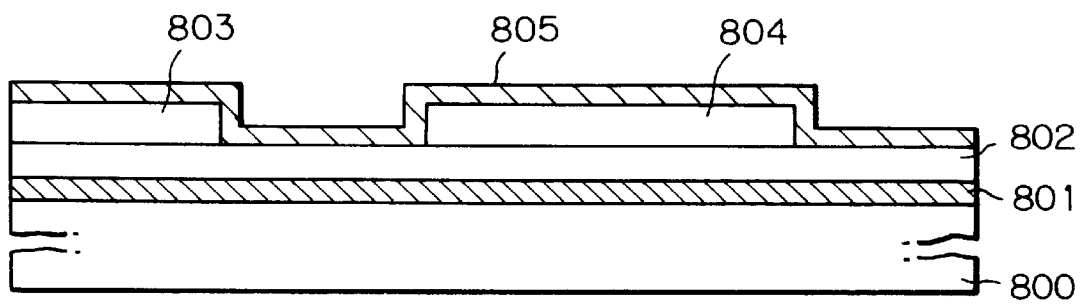
Figure 8C:
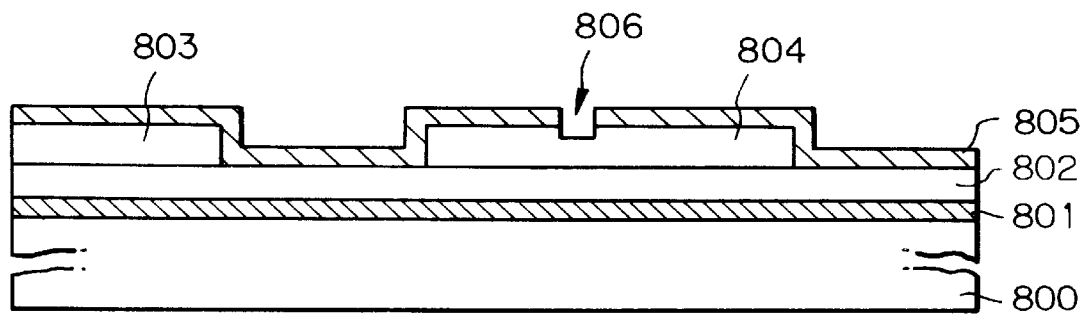
Figure 8D:
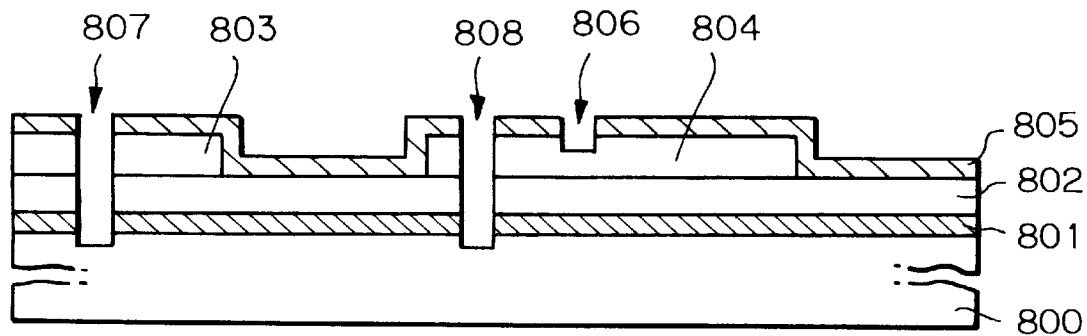
Figure 9A:
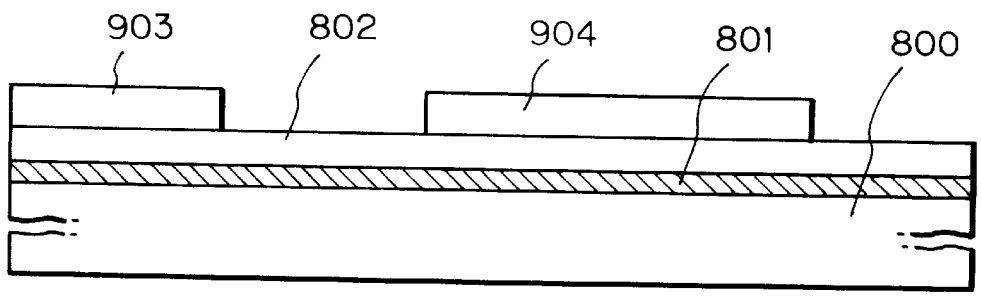
FIGS. 9a to 9g are cross-sectional views taken along the line IX—IX of FIG. 7, illustrating the production steps of the solar cell of the embodiment thereof.
Figure 9B:
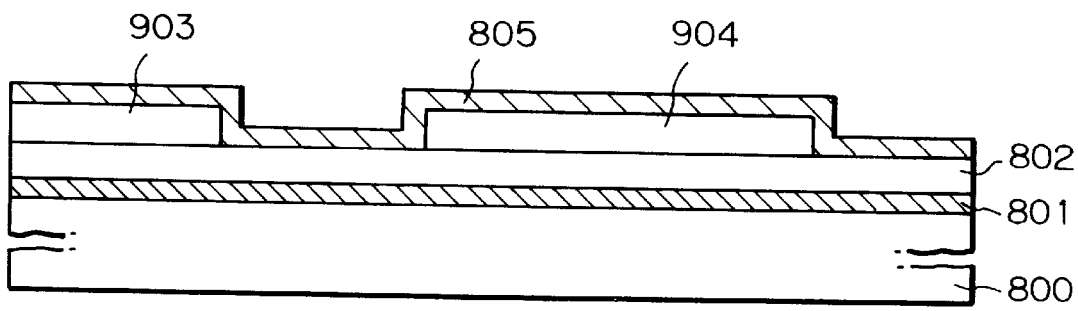
Figure 9C:
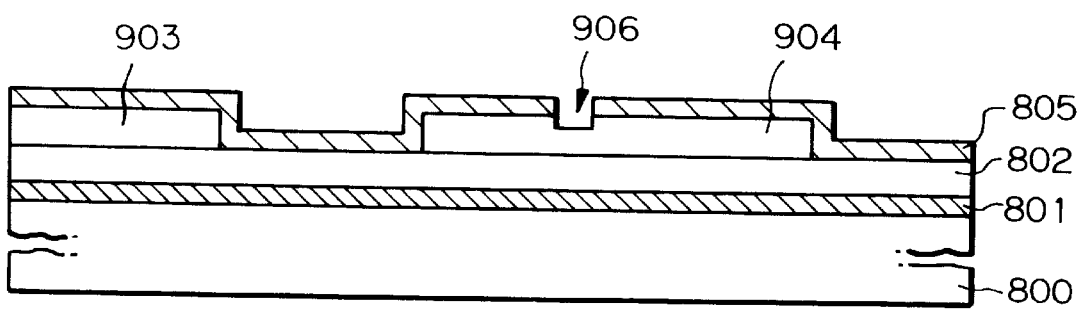
Figure 9D:
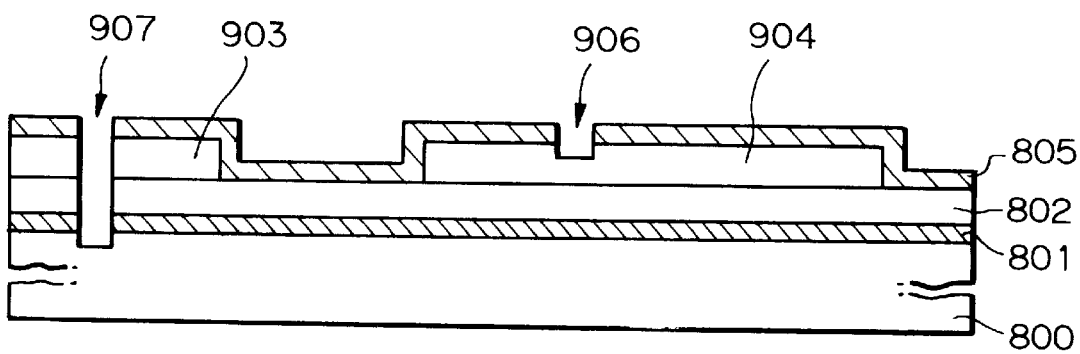

First, as shown in FIGS. 8a and 9a, an aluminum electrode 801 is deposited on a substrate 800. On the aluminum electrode 801 is formed a photoelectric conversion layer 802 of a semiconductor deposited in order of N-I-P types from the substrate 800 side. The film formation of the aluminum electrode 801 is carried out by a sputtering process. Further, the formation of the photoelectric conversion layer 802 is carried out by depositing some layers by use of a plasma CVD process.

Next, first resin layers 803 and 804 (903 and 904) are formed by a printing process. The formation of the resin layers are continuously carried out with respect to a long film substrate. The resin layer 803 (903) is provided on an annular region (where a scribed slot 807 (907) is formed later) which corresponds to the outer periphery portion in FIG. 7. Further, the resin layer 804 (904) is provided on an annular region (where a scribed slot 806 (906) is formed later) which corresponds to a circle shown by a scribed portion 708 in FIG. 7.

The resin layer 804 becomes a base layer for the annularly formed slot 806. Further, the resin layer 804 has a function of preventing the occurrence of damage to the photoelectric conversion layer 802, under the contact electrode which is formed by a printing process later.

Thus, a structure of the solar cell shown in FIGS. 8a and 9a is obtained.

Next, an ITO electrode 805 which is a transparent electrode is deposited on the entire exposed surface. The formation of this ITO film is continuously carried out with respect to the long film wound around the roll. Thus, a structure of the solar cell shown in FIGS. 8a and 9a is obtained.

Scribing is then carried out by irradiation of a laser beam. This step is referred to as a laser scribing step. In this laser scribing step, scribing in a required layer is carried out by irradiation of a laser beam while scanning a YAG laser with a spot diameter of 80 μm. In this case, scribing of ITO film 805 is selectively carried out by a laser scribing process.

In this step, the ITO 805 film is scribed to form a slot 806 (906) (see FIGS. 8c and 9c). This slot 806 (906) is annularly formed as a scribed portion 708 in FIG. 7.

When a laser beam is irradiated to form the slot 806 (906), it is important that the resin layer 804 (904) exists as a base layer. If the resin layer 804 (904) does not exist, the laser beam can reach the photoelectric conversion layer 802 due to the dispersion of the output of the laser beam. In a further extreme case, a slot can be formed in even the aluminum electrode 801 by the laser beam.

It is no problem that the photoelectric conversion layer 802 is scribed in the lower portion of the scribed portion 708. This is because the photoelectric conversion layer does not contribute to the photoelectric conversion to be required. However, when the laser beam reaches the aluminum electrode 801, a risk of forming a short circuit occurs between the transparent electrode 805 and the aluminum electrode 801. That is, the material of the aluminum electrode 801 is melted by the energy of the laser beam, and the melt reaches the transparent electrode 805, whereby the possibility of forming a short circuit occurs between both electrodes. Since the distance between the transparent electrode 805 and the aluminum electrode 801 is only about 1 μm, the possibility of forming a short circuit between both electrodes is significantly high.

Further, when the aluminum electrode 801 is completely cut off due to too strong irradiation energy of the laser beam, there arises the possibility that photoelectric conversion devices can not be connected to each other later.

That is, when the aluminum electrode 801 is completely cut in the lower portion of the scribed portion 708 of the ITO electrode 805, in a cross sectional portion (shown in FIGS. 9a to 9g) shown by the line IX—IX of FIG. 7, the electrical connection between the photoelectric conversion device 700 and the photoelectric conversion device 703 becomes impossible. Even if the aluminum electrode 801 is not completely cut in the lower portion of the scribed portion 708 of the ITO electrode 805, when the portion is damaged by the irradiation of laser beam, there arise contact failures between the photoelectric conversion devices and the increase of contact resistance.

According to the constitution shown by the present embodiment, the laser beam does not reach the aluminum electrode 801 due to the presence of the resin layer 904. Thus, it can be avoided to electrically connect the transparent electrode 805 to the aluminum electrode 801. Further, cutting and damaging of the aluminum electrode 801 can also be prevented. As a result, the production yield can drastically be enhanced. Thus, the structure shown in FIGS. 8c and 9c is obtained.

Next, a laser scribing is carried out again at a higher output of the laser beam than in the laser scribing for the formation of the above-described slot 806 (906). In this step, a slot 807 (907) and a slot 808 (see FIGS. 8d and 9d) are formed.

As apparent from these drawings, in this step, the conditions of the irradiation of laser beam are set, so that the bottom portions of the slots 807 (907) and 808 can be extended within the substrate 800. The conditions of the irradiation of laser beam for the formation of the slots 807 (907) and 808 may be the same.

The slot 807 (907) is annularly formed, as shown by the scribed portion 707 in FIG. 7.

The slot 808 is formed to cut the aluminum electrode 801 around the periphery of a region for proving an externally drawing electrode. This slot 808 is communicated with the slot 807. The slots 807 and 808 are formed so that a part (a closed region, in which a through-slot, 809, which will be later described is formed) of the aluminum electrode 801 surrounded by these slots 807 and 808 is completely electrically isolated from the periphery.

A short circuit between the aluminum electrode 801 and the ITO electrode 805 can be prevented by the presence of the first resin layers 803 (903) and 804, during the formation of the slots 807 (907) and 808. That is, when these resin layers 803 (903) and 804 do not exist, a short circuit between the aluminum electrode 801 and the ITO electrode which is near the aluminum electrode 801 is often formed by a part of the melted aluminum electrode.

Thus, the structure shown in FIGS. 8d and 9d is obtained.

Figure 8E:
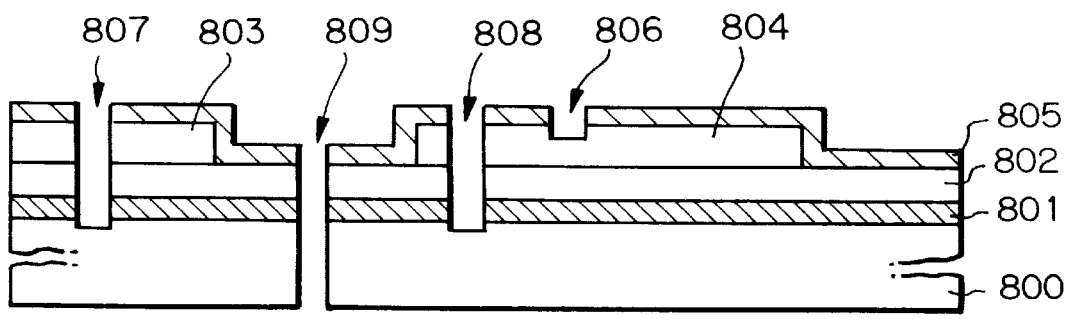

Next, a through-slot 809 shown in FIG. 8e is formed by irradiation of a laser beam. This slot 809 is penetrated to the back of the substrate 800, with the back being a position denoted by the reference numeral 711 in FIG. 7. This slot 809 is used as a conductive path or channel 813 in forming a drawing electrode which is finally connected to the back of the substrate 800. The position of the slot 809 becomes a position of an externally drawing electrode.

Figure 8F:
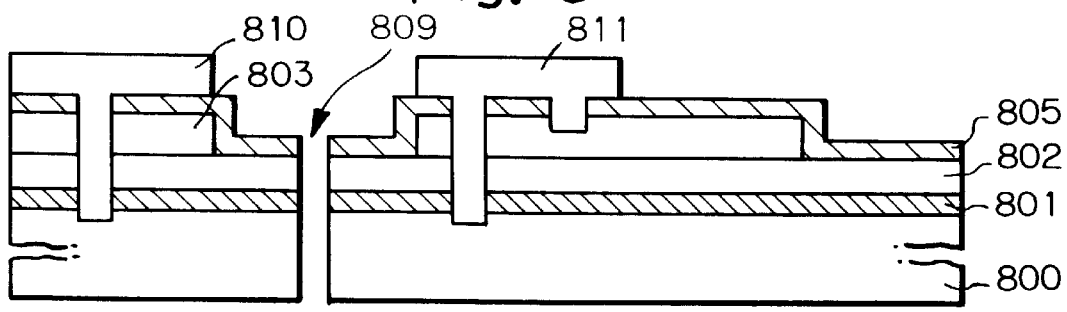
Figure 9E:
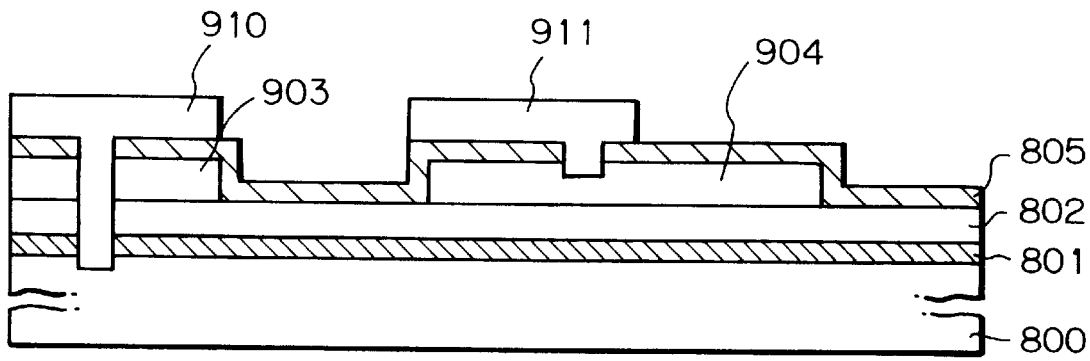

After that, as shown in FIGS. 8f and 9e, a second resin layers 810 (910) and 811 (911) are formed. These resin layers 810 (910) and 811 (911) play a role to fill the slots 806 (906), 807 (907) and 808 with a resin material. Further, the resin layers also act as an isolation film which is a lower layer for a contact electrode.

These second resin layers 810 (910) and 811 (911) are formed by use of a printing process.

As shown in FIGS. 8g and 9f and FIGS. 10 and 11 which will be described later, contact electrodes 709, 710, 711, 712 and 713 are then formed by use of a silver paste, These contact electrodes are also formed by a printing process. Each position of the contact electrodes 709, 710, 711, 712 and 713 is shown in FIG. 7.

Figure 9F:
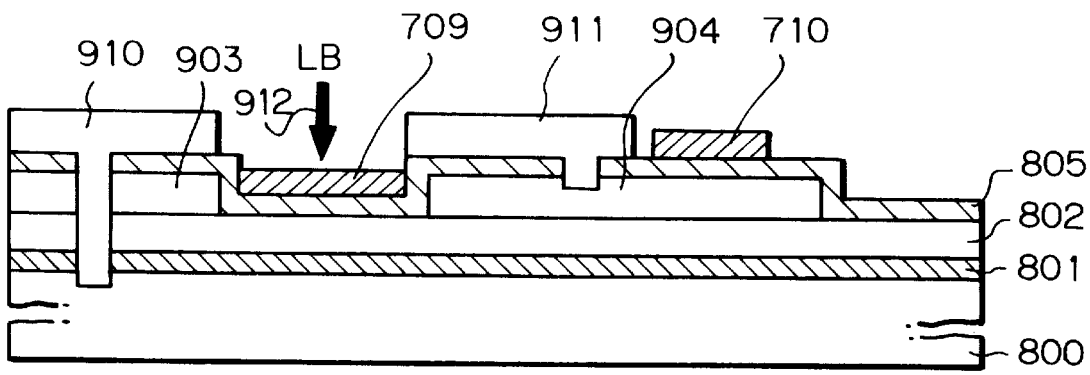

After that, irradiation of a laser beam is carried out at a portion in a direction of the arrow 912 to form a conductive path 913 for electrically connecting the aluminum electrode 801 to the contact electrode 709, as shown in FIG. 9f. In this step, the conductive path 913 is formed by forming a slot for the contact, and at the same time, by melting both the silver paste of the contact electrode 709 and the aluminum electrode 801. This step is well known as a laser bonding.

Figure 9G:
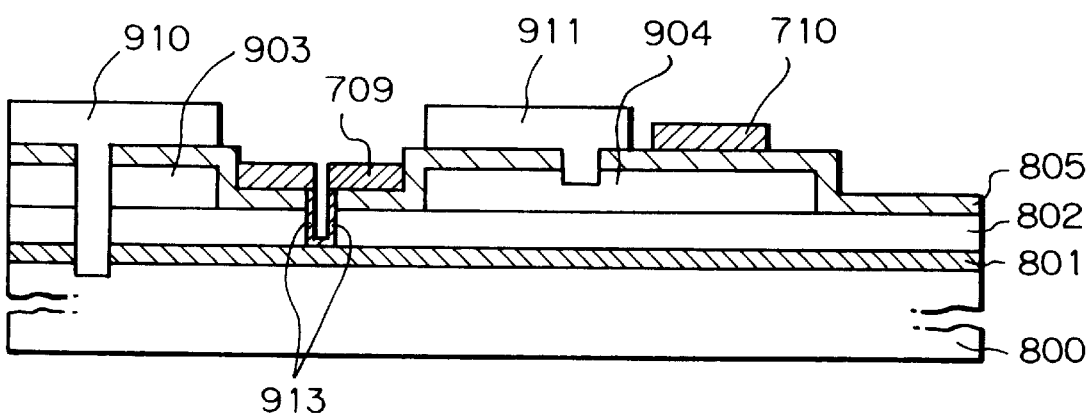

Thus, a structure with a cross-section shown in FIG. 9g taken along the line IX—IX of FIG. 7 is completed. As shown in FIG. 9g, the aluminum electrode 801 of the photoelectric conversion device 703 is electrically connected to the silver paste pattern (contact electrode) connected to the ITO electrode of the photoelectric conversion device 700 by the laser bonding.

Consequently, a state where the photoelectric conversion device 703 is connected to the photoelectric conversion device 700 in series is obtained. Three connected portions other than the above-mentioned connected portion are formed in this structure. According to thus connected structure, Each of the photoelectric conversion devices 703, 700, 701 and 702 is connected to each other in series.

Figure 8G:
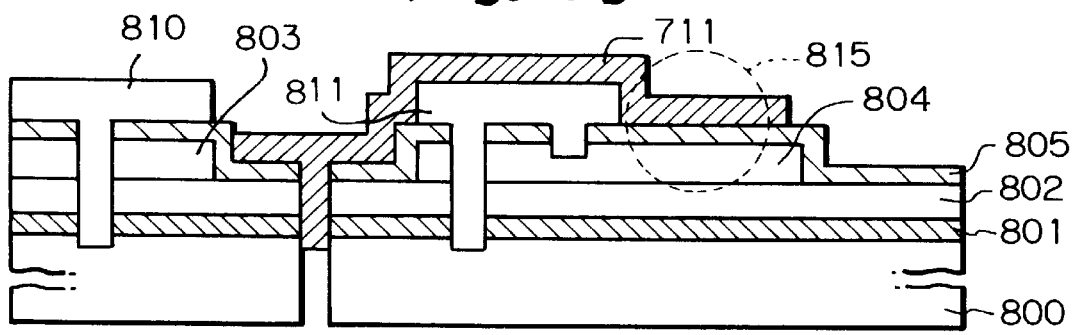
Figure 8H:
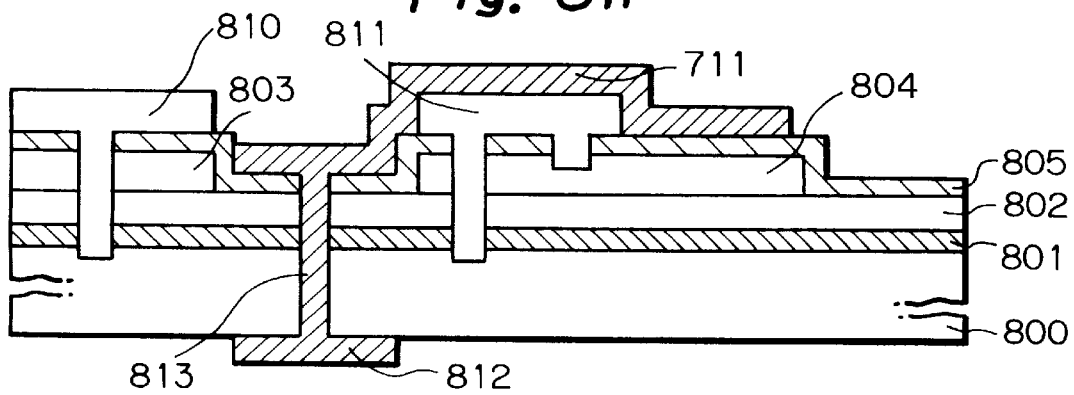

On the other hand, as shown in FIGS. 8g and 8h which are cross-sectional views taken along the line VIII—VIII of FIG. 7, after forming a contact electrode 711 of a silver paste, a contact electrode is formed on the back of the substrate 800 by use of a silver paste. The formation of this contact electrode 812 is also carried out by a printing process.

In the step for forming the contact electrode 711 of the silver paste, it is also very important that a resin layer 804 exists under the contact electrode 711, the corresponding portion being denoted as the reference numeral 815 in FIG. 8g. This is because the photoelectric conversion layer 802 is damaged by the silver particles contained in the silver paste, during printing, whereby electrical connection between the aluminum electrode 801 and the ITO electrode 805 is established.

This contact electrode 812 is electrically connected to the contact electrode 711 through the conductive path 813 of a silver paste formed in the through-slot, and is therefore, electrically connected to the ITO electrode 805 of the photoelectric conversion device 702.

Thus, the contact electrode 812 formed on the opposite side to the surface side shown in FIG. 7 acts as a drawing electrode drawn from the ITO electrode 805 (see FIG. 8h) of the photoelectric conversion device 702 (see FIG. 7).

The ITO electrode 805 is in contact with a P type semiconductor layer on the light incidence side for the photoelectric conversion device 702. Therefore, the contact electrode 812 is a drawing electrode in which the plus voltage is output.

Figure 10:
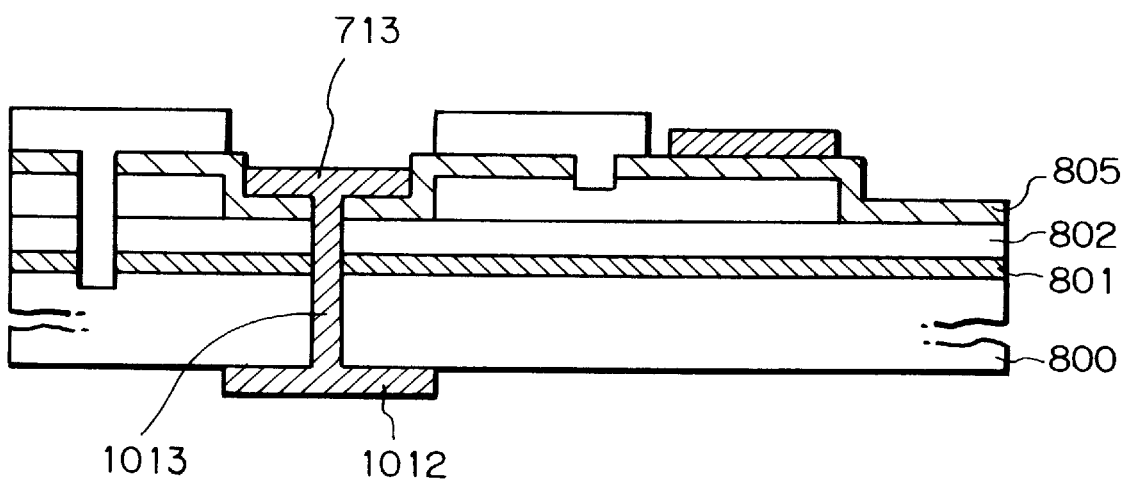
FIG. 10 is a cross-sectional view taken along the line X—X of FIG. 7, illustrating the structure of the solar cell of the embodiment thereof.
Figure 11:
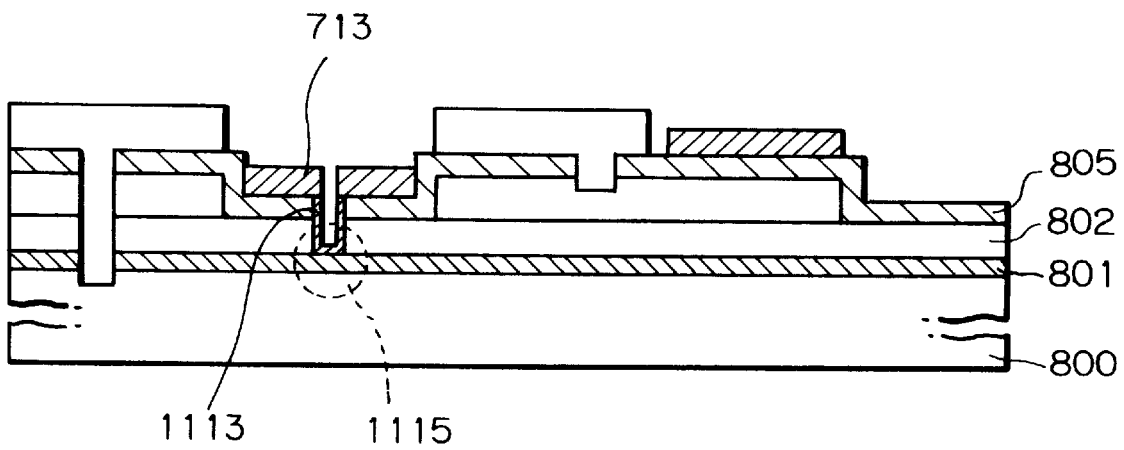
FIG. 11 is a cross-sectional view taken along the line XI—XI of FIG. 7, illustrating the structure of the solar cell of the embodiment thereof.

FIG. 10 is a cross-sectional view taken along the line X—X of FIG. 7, illustrating a structure of the solar cell of the present embodiment, and FIG. 11 is a cross-sectional view taken along the line XI—XI of FIG. 7, illustrating a structure of the solar cell of the present embodiment. In this portion of the structure is formed a drawing electrode (minus voltage side) drawn from the N type semiconductor layer of the photoelectric conversion device 701.

As shown in FIG. 10, a contact electrode (drawing electrode) 1012 of a silver paste electrically connected to the aluminum electrode 801 (aluminum electrode of the photoelectric conversion device 701) through a conductive path 1013 is formed on the back of the substrate 800.

A structure for ensuring the electrical connection between the aluminum electrode 801 and the drawing electrode 1012 has a cross-section shown in FIG. 11 taken along the line XI—XI of FIG. 7. That is, the contact is formed at a position denoted as 1115 by use of laser bonding. Particularly, the aluminum electrode 801 is electrically connected to the contact electrode 713 of the silver paste through a conductive path.

Finally, an individual solar cell is completed by blanking a number of solar cells which were formed to have a long film as a base substrate. Thus, a number of solar cells whose outward appearances are shown in FIG. 7 are obtained.

Thus, the solar cell showing the outward appearance from the top in FIG. 7 is constructed so that it extracts the photoelectromotive force from the drawing electrode 812 drawn from a P type semiconductor layer of the photoelectric conversion device 702 (which is on the back of the electrode 711 (FIG. 8h)), and the drawing electrode 1012 drawn from an N type semiconductor layer of the photoelectric conversion device 701 (which is on the back of the electrode 713 (FIG. 10)).

The laser scribing process used in the above-mentioned embodiment will now be described. As a laser scribing process, a process for forming a slot with a desired pattern by irradiating a spot-shaped laser beam while scanning is generally used.

When an annual slot which is provided at the positions of 207 and 707 or positions 208 and 708, as shown in FIGS. 2 and 7, respectively, the problem that the start point of the laser scribing does not meet the end point thereof can occur.

Figure 12A:
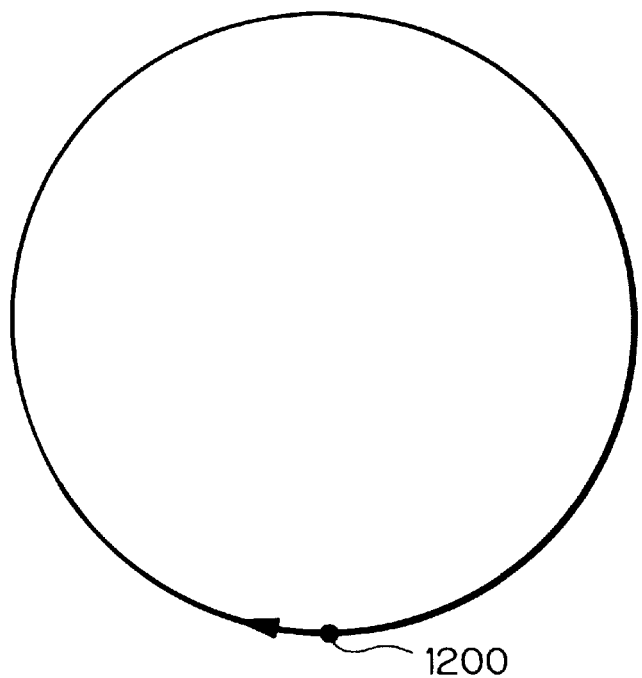
FIGS. 12a and 12b are views for explaining tracks of a laser scribing.

FIG. 12a shows a track which was formed by a laser scribing in which irradiation of a laser beam is started from a start point 1200, circulated and returned to the start point 1200.

Generally, a spot diameter of a laser beam for a laser scribing ranges from about a few tens μm to about a few hundreds μm. In such sequential steps using a long film as in the above-described embodiment, it is very difficult to prevent misregistration of such spot diameter. Thus, when a number of steps are continuously carried out, the start point of the laser scribing sometimes does not meet the end point thereof. Furthermore, at the point (the start point of a laser scribing) where a laser beam is first irradiated and at the point (the end point of a laser scribing) where a laser beam is last irradiated, a short circuit is likely to be formed between the upper photoelectric conversion layer and lower photoelectric conversion layer.

Figure 12B:
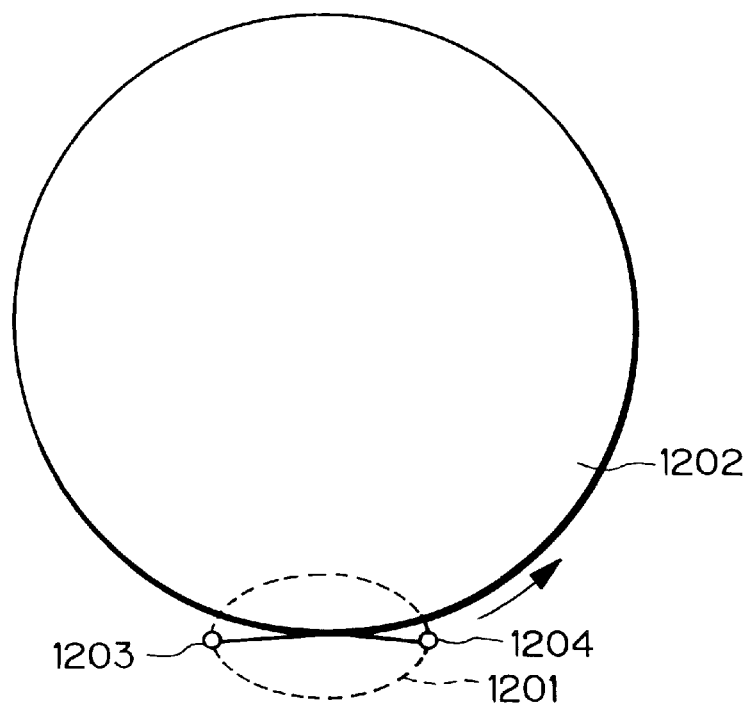

Such problems can be solved by a laser scribing which forms a track such as is shown in FIG. 12b. Thus, a laser scribing is carried out so that the start point (starting position) 1203 of the laser scribing and the end point (ending position) 1204 thereof do not exist within the region 1202 (inside the scribed tracks) where photoelectric conversion devices are formed). Thus, the start point (starting position) 1203 of the laser scribing and the end point (ending position) 1204 thereof exist outside the circle where photoelectric conversion devices are formed.

Accordingly, a looped track of the laser scribing can surely be formed. Further, various effects derived from existence of the start point and end point of a laser scribing can be avoided. That is, since the start point 1203 and end point 1204 of the laser scribing do not exist in the device formation region 1202, even if a short circuit is formed at the points, no problem occurs.

In the above embodiments, each solar cell with an entire outward appearance and fan-shaped photoelectric conversion devices has been described and illustrated. However, it is apparent that the entire outward appearance of each solar cell may be a polygon such as a square, hexagon or octagon.

Figure 13:
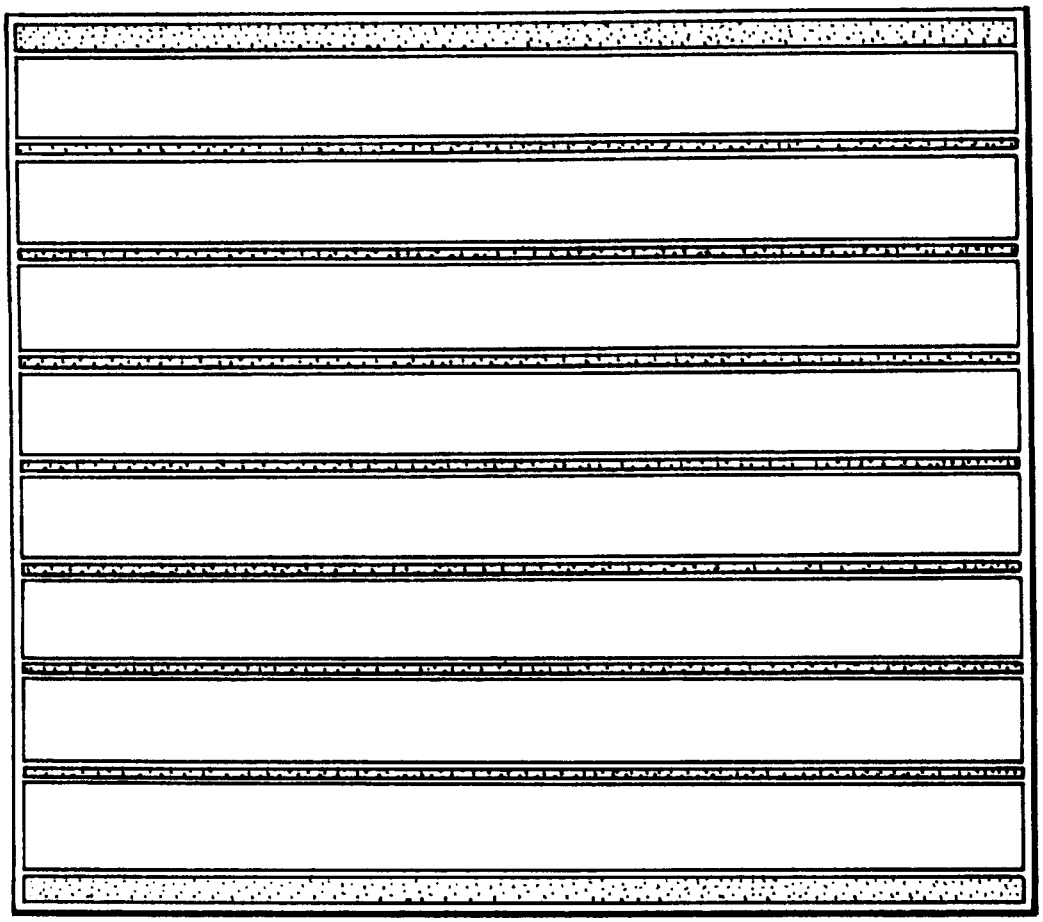
FIG. 13 is a plan view of a solar cell which is arranged on a dial face of a watch as another embodiment of the present invention, the solar cell being viewed from above.

FIG. 13 is a plan view of a solar cell 1300 which is arranged on a dial face of a watch as another embodiment of the present invention, the solar cell being viewed from above. In this embodiment, the outward appearance of solar cell is a square. Each photoelectric conversion device is rectangular. The photoelectric conversion devices are sequentially arranged in eight layers in a vertical direction. These eight layered photoelectric conversion devices are connected to each other in series. The drawing electrodes for the other constructions, operations and effects of the present embodiment are almost the same as those of the above-described embodiment.

Figure 14:
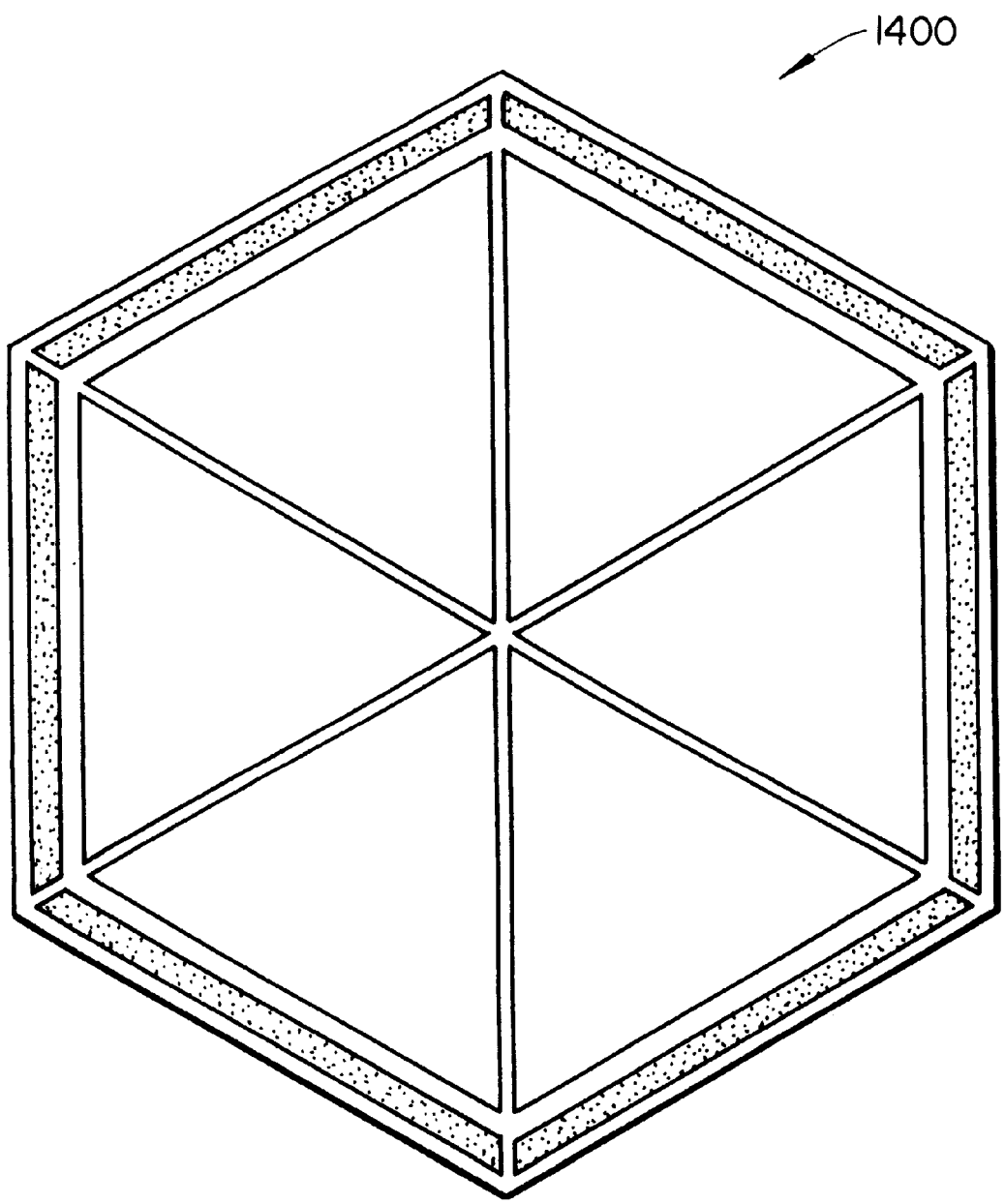
FIG. 14 is a plan view of a solar cell which is arranged on a dial face of a watch as still another embodiment of the present invention, the solar cell being viewed from above.

FIG. 14 is a plan view of a solar cell 1400 which is arranged on a dial face of a watch as still another embodiment of the present invention, the solar cell being viewed from above. In this embodiment, the outward appearance of solar cell is a hexagon. Each photoelectric conversion device is triangular. These six photoelectric conversion devices are connected to each other in series. Other constructions, operations and effects of the present embodiment are almost the same as those of the above-described embodiments.

Figure 15:
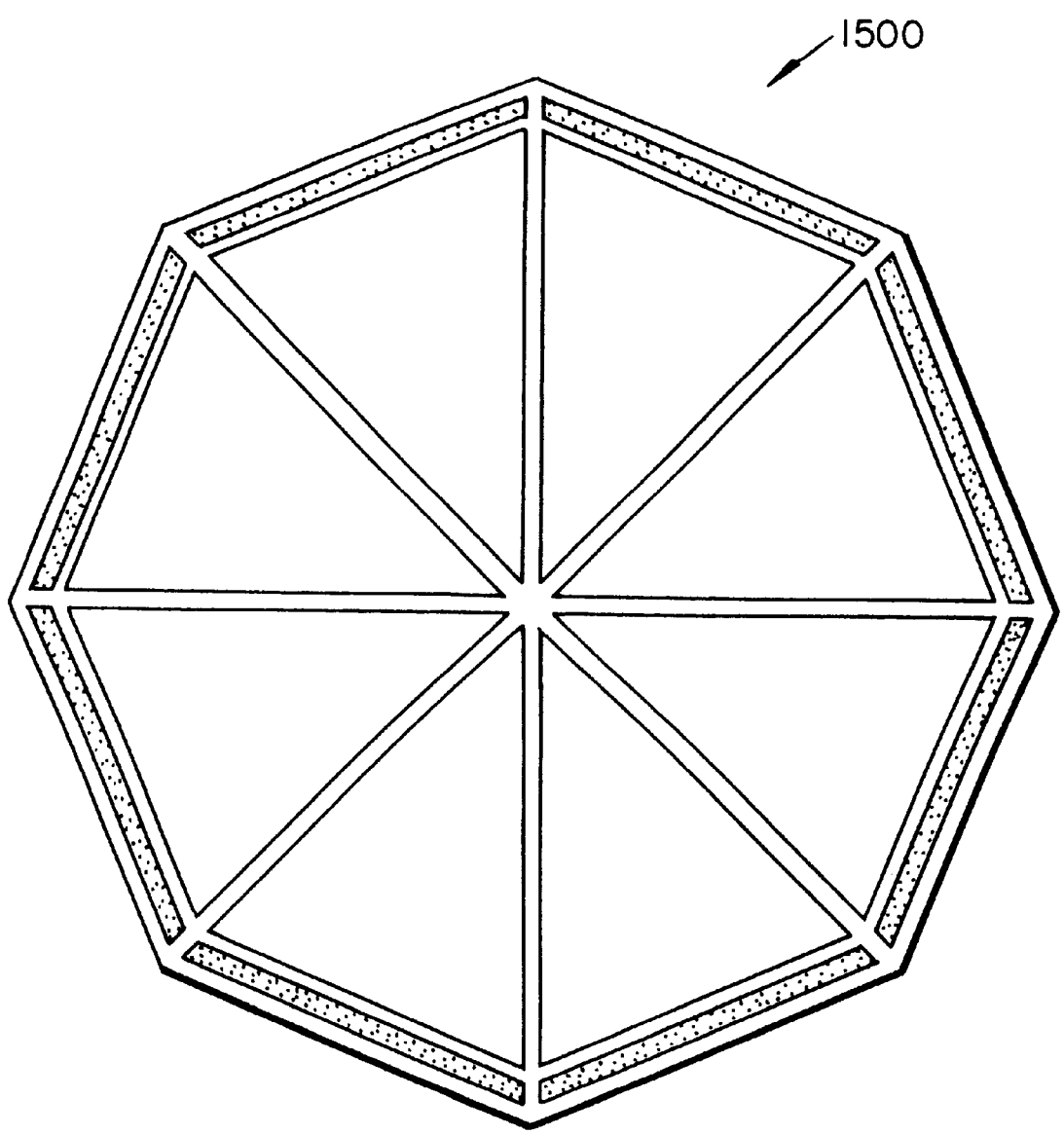
FIG. 15 is a plan view of a solar cell which is arranged on a dial face of a watch as another embodiment of the present invention, the solar cell being viewed from above.

FIG. 15 is a plan view of a solar cell 1500 which is arranged on a dial face of a watch as another embodiment of the present invention, the solar cell being viewed from above. In this embodiment, the outward appearance of the solar cell is an octagon. Each photoelectric conversion device is triangular. These eight photoelectric conversion devices are connected to each other in series. Other constructions, operations and effects of the present embodiment is almost the same as those of the above-described embodiments.

According to the above-described embodiments, a solar cell which is mounted on a wrist watch can be produced at a low cost. A high reliability of the solar cell can also be obtained. Further, since the drawing electrode from which the output of the solar cell is extracted can be provided on an opposite side to a light irradiated (or light incidence) surface of the solar cell, the structure for the extraction of the output can be simplified. Further, a surface area which contributes to the photoelectric conversion can be increased as large as possible.

Furthermore, even when an electrode is formed on the top of the photoelectric conversion device by use of a printing process, damaging the photoelectric conversion device can effectively be prevented. Further, a solar cell can be produced at a high production yield.

What is claimed is:

1. A planer solar cell array comprising:

a plurality of photoelectric conversion devices formed by dividing the plane, each of said photoelectric conversion devices including a substrate, a first electrode layer deposited on said substrate, a photoelectric conversion semiconductor layer deposited on said first electrode layer, a resin layer partially deposited on said photoelectric conversion semiconductor layer, a light transmitting second electrode layer deposited on said photoelectric conversion semiconductor layer and said resin layer, and a third electrode layer deposited on a part of said second electrode layer, said third electrode layer being connected to said second electrode layer only within a region where said resin layer exists so that current produced by said photoelectric conversion semiconductor layer flows from said region of said second electrode layer to said third electrode layer;

a plurality of conductive paths for connecting each of said photoelectric conversion devices to each other in series, said conductive paths being provided adjacent to said plurality of photoelectric conversion devices; and two externally drawing electrodes exposed on an opposite surface to a light irradiated surface, said electrodes being connected to two photoelectric conversion devices on both ends of said photoelectric conversion device connected in series, one of said two externally drawing electrodes being connected to said region of said second electrode layer of said photoelectric conversion device on one end thereof via said third electrode layer to extract said current.

2. A planar solar cell array according to claim 1, wherein the other of said two externally drawing electrodes is connected to the first electrode layer of said photoelectric conversion device on the other end thereof.

3. A planar solar cell array according to claim 2, wherein said cell further includes a first through-slot which electrically connects said second electrode layer to one of said externally drawing electrodes.

4. A planar solar cell array according to claim 3, wherein said first through-slot is formed on a region where said first electrode layer and a part of said photoelectric conversion semiconductor layer is isolated from other portions.

5. A planar solar cell array according to claim 2, wherein said cell further includes a second through-slot which electrically connects said first electrode layer to said other externally drawing electrode.

6. A planar solar cell array according to claim 1, wherein said plurality of conductive paths and said two externally drawing electrodes are provided on outer peripheral portions of said plurality of photoelectric conversion devices, said solar cell being circular, said plurality of photoelectric conversion devices being a plurality of fan-shaped photoelectric conversion devices formed so that the circular plane is divided in radial directions.

7. A planar solar cell array according to claim 1, wherein said plurality of conductive paths and said two externally drawing electrodes are provided on outer peripheral portions of said plurality of photoelectric conversion devices, said solar cell being polygonal, said plurality of photoelectric conversion devices being plurality of triangle-shaped photoelectric conversion devices formed so that the polygonal plane is divided in radial directions.

8. A planar solar cell array according to claim 1, wherein said plurality of conductive paths are provided between said plurality of photoelectric conversion devices and said two externally drawing electrodes are provided on outer sides of said photoelectric conversion devices on both ends, said solar cell being rectangular, said plurality of photoelectric conversion devices being plurality of rectangular photoelectric conversion devices formed so that the rectangular plane is divided in longitudinal directions.

9. A planar solar cell array according to claim 1, wherein said photoelectric conversion semiconductor layer is composed of a PIN type non-single crystalline silicon film.

10. A planar solar cell array according to claim 1, wherein said second electrode layer is composed of an indium tin oxide film.

11. A planar solar cell array according to claim 1, wherein said first electrode layer is composed of an aluminum film.

12. A planar solar cell array according to claim 1, wherein said third electrode layer is composed of a conductive paste film in the binder of which are dispersed metal particles.

13. A planar solar cell array according to claim 1, wherein said externally drawing electrode is composed of a conductive paste film in the binder of which are dispersed metal particles.

14. A solar cell comprising:

a first electrode layer;

a photoelectric conversion semiconductor layer deposited on said first electrode layer;

a resin layer partially deposited on said photoelectric conversion semiconductor layer;

a second electrode layer deposited on said photoelectric conversion semiconductor layer and said layer; and a third electrode layer deposited on a part of said second electrode layer, said third electrode layer being connected to said second electrode layer only within a region where said resin layer exists so that current produced by said photoelectric conversion semiconductor layer flows from said region of said second electrode layer to said third electrode layer, said region of said second electrode layer being connected to an externally drawing electrode via said third electrode layer to extract said current.

15. A solar cell according to claim 14, wherein said photoelectric conversion semiconductor layer is composed of a PIN type non-single crystalline silicon film.

16. A solar cell according to claim 14, wherein said second electrode layer is composed of an indium tin oxide film.

17. A solar cell according to claim 14, wherein said first electrode layer is composed of an aluminum film.

18. A solar cell according to claim 14, wherein said third electrode layer is composed of a conductive paste film in the binder of which are dispersed metal particles.

19. A solar cell according to claim 14, wherein said externally drawing electrode is composed of a conductive paste film in the binder of which are dispersed metal particles.

20. A method for producing a solar cell comprising the steps of:

depositing a first electrode layer on a substrate;

depositing a photoelectric conversion semiconductor layer on said first electrode layer;

depositing a resin layer on a part of said photoelectric conversion semiconductor layer;

depositing a second electrode layer on said photoelectric conversion semiconductor layer and said resin layer; and depositing a third electrode layer on said second electrode layer, said third electrode layer being connected to said second electrode layer only within a region where said resin layer exists so that said photoelectric conversion that said photoelectric conversion semiconductor layer is connected to said first electrode layer and said second electrode layer, and that current produced by said photoelectric conversion semiconductor layer is extracted from said region of said second electrode layer to an externally drawing electrode via said third electrode layer.

21. A production method according to claim 20, wherein the deposition step of said photoelectric conversion semiconductor layer is a step of depositing a PIN type non-single crystalline silicon film.

22. A production method according to claim 20, wherein the deposition step of said second electrode layer is a step of depositing an indium tin oxide film.

23. A production method according to claim 20, wherein the deposition step of said first electrode layer is a step of depositing an aluminum film.

24. A production method according to claim 20, wherein the production step of said third electrode layer is a step of forming a conductive paste film in the binder of which are dispersed metal particles.

25. A solar cell comprising:

a first electrode layer;

a photoelectric conversion semiconductor layer deposited on said first electrode layer;

a resin layer partially deposited on said photoelectric conversion semiconductor layer;

a second electrode layer deposited on said photoelectric conversion semiconductor layer and said resin layer; and a third electrode layer deposited on a part of said second electrode layer, said third electrode layer being connected to said second electrode layer only within a region where said resin layer exists, that current produced by said photoelectric conversion semiconductor layer flows from said region of said second electrode layer to said third electrode layer, said region of said second electrode layer being connected to an externally drawing electrode exposed on an opposite, surface to a light irradiated surface via said third electrode layer to extract said current.

26. A method for producing a solar cell comprising the steps of:

depositing a first electrode on a substrate;

depositing a photoelectric conversion semiconductor layer on said first electrode layer;

depositing a resin layer on a part of said photoelectric conversion semiconductor layer;

depositing a second electrode layer on said photoelectric conversion semiconductor layer and said resin layer, and depositing a third electrode layer on said second electrode layer, said third electrode layer being connected to said second electrode layer only within a region where said resin layer exists, so that said photoelectric conversion semiconductor layer is connected to said first electrode layer and said second electrode layer, and said second electrode layer is connected that current produced by said photoelectric conversion semiconductor layer is extracted from said region of said second electrode layer to an externally drawing electrode exposed on an opposite surface to a light irradiated surface via said third electrode layer.

* * * * *